(12) United States Patent
Liu et al.

(10) Patent No.: US 6,219,797 B1
(45) Date of Patent: Apr. 17, 2001

(54) MICROCONTROLLER WITH SELECTABLE OSCILLATOR SOURCE

(75) Inventors: Shyun Liu, San Jose, CA (US); Wendell Little, Denton, TX (US); Steve Grider; Matt Adams, both of Dallas, TX (US)

(73) Assignee: Dallas Semiconductor Corporation, Dallas, TX (US)

( * ) Notice: Subject to any disclaimer, the term of this patent is extended or adjusted under 35 U.S.C. 154(b) by 0 days.

(21) Appl. No.: 09/007,263

(22) Filed: Jan. 14, 1998

Related U.S. Application Data

(63) Continuation-in-part of application No. 08/412,664, filed on Mar. 29, 1995, now abandoned, which is a continuation-in-part of application No. 08/015,691, filed on Feb. 9, 1993, now Pat. No. 5,473,271, and a continuation-in-part of application No. 08/196,273, filed on Feb. 9, 1994, now abandoned.

(51) Int. Cl.[7] .................................................. G06F 1/04
(52) U.S. Cl. ........................ 713/500; 713/322; 713/601
(58) Field of Search .................................... 713/500, 600, 713/322, 601; 712/1

(56) References Cited

U.S. PATENT DOCUMENTS

| | | | |
|---|---|---|---|
| 4,893,271 | 1/1990 | Davis et al. | 364/900 |
| 4,908,790 | 3/1990 | Little et al. | 364/900 |
| 5,047,967 | 9/1991 | Sander et al. | 364/569 |
| 5,237,699 | 8/1993 | Little et al. | 395/750 |
| 5,303,390 | 4/1994 | Little | 395/575 |
| 5,502,689 | * 3/1996 | Peterson et al. | 368/156 |
| 5,515,540 | 5/1996 | Grider et al. | 395/750 |
| 5,550,489 | * 8/1996 | Raab | 326/93 |
| 5,754,462 | 5/1998 | Little | 364/900 |
| 5,832,207 | 11/1998 | Little et al. | 395/186 |
| 5,903,767 | 5/1999 | Little | 395/750.05 |

* cited by examiner

Primary Examiner—Dennis M. Butler
(74) Attorney, Agent, or Firm—Jenkens & Gilchrist

(57) ABSTRACT

An 8051 microprocessor core having an ability to operate via an external crystal oscillator or be switched to operate in a low power mode via an internal ring oscillator.

11 Claims, 7 Drawing Sheets

MICROCONTROLLER WITH SELECTABLE OSCILLATOR SOURCE

CROSS REFERENCE TO RELATED APPLICATIONS

This application is a continuation-in-part of Ser. No. 08/412,664 filed Mar. 29, 1995, now abandoned, which is a continuation in part of both Ser. No. 08/015,691 filed Feb. 9, 1993, now U.S. Pat. No. 5,473,271 and Ser. No. 08/196,273 filed Feb. 9, 1994, now abandoned. These applications are all co-assigned and are also hereby incorporated by reference.

BACKGROUND OF THE PRESENT INVENTION

1. Field of the Invention

The present invention relates to integrated circuit electronic devices, and, more particularly, to microcomputers, microcontrollers, and microprocessors.

2. Background and Objects of the Present Invention

The demand for ever higher performance from computers generally, and microprocessors and microcontrollers in particular, has led to various enhancements, including higher clock rates and simpler instruction sets. Consequently, the control and flexibility of clock speeds and rates for all circuits, especially microprocessor and microcontroller integrated circuits, has become critical, as designers attempt to design faster and faster microprocessors and microcontrollers. Previous control systems for oscillators were simplistic and/or relied primarily on prewired hardware circuits, which are not very flexible.

SUMMARY OF THE INVENTION

Preferred system embodiments of the disclosed CMOS 8-bit Microcontroller System Specification have a number of unique features. Preferred embodiments provide the software control of either an external crystal oscillator or an on-chip internal ring oscillator, so that the user can choose whether to use external crystal oscillator or internal ring oscillator as the main source clock to the system. Preferred embodiments also provide for software control to disable/enable the external oscillator while running from the internal ring oscillator, so that the user has the ability to disable an external oscillator to reduce current consumption tremendously. Preferred embodiments also provide for software control to divide the main system clock (ring or external crystal oscillator) to provide lower operating current, so that the user can change system clock divide ratio to lower operating current. Preferred embodiments have software enable/disable of a "Switch-back" mode to allow interrupts or serial port activity to immediately switch high divide ratios (slow clocks) to a lower divide ratio (high speed clocks), which allows switching back immediately in the event of interrupts or serial port activity, it will process information as soon as possible without losing any kind of data. Preferred embodiments also enable the software selection of a DX2 clocking system in which the DX2 clock generator is software enabled/disabled and provides 2× frequency multiplication of the crystal oscillator for use as an optional system clock source, so that the frequency is doubled. Preferred embodiments also provide a frequency doubler with 50 percent duty cycle.

Preferred embodiments have the following features and advantages: compatible with Intel 80C52 (in that preferred embodiments have pin orientation and instruction sets that are compatible with the Intel 8051, four 8-bit I/O ports, three 16-bit timer/counters, and 256 bytes scratchpad RAM); large on-chip memory (16K bytes EPROM (OTP) and 1K byte extra on-chip SRAM for MOVX); ROMSIZE Feature (selects effective on-chip ROM size from 0 to 16K; allows access to entire external memory map; dynamically adjustable by software and useful as boot block for external FLASH); High-Speed Architecture (4 clocks/machine cycle (Intel 8051 has 12); Runs DC to 33 MHz clock rates; Single-cycle instruction in 121 nS; Dual data pointer; Optional variable length MOVX to access fast/slow RAM/peripherals; Power Management Mode (Programmable clock source to save power; CPU runs from (crystal/64) or (crystal/1024); provides automatic hardware and software exit); EMI Reduction Mode disables ALE; two full-duplex hardware serial ports; High integration controller (power-fail reset; early-warning power-fail interrupt; programmable Watchdog timer); and 16 total interrupt sources with 6 external. Preferred embodiments have 40-pin PDIP, 44-pin PLCC, 44-pin PQFP, and 40-pin windowed CERDIP packages.

BRIEF DESCRIPTION OF THE DRAWINGS

Further features and advantages will become apparent from the following and more particular description of the various embodiments of the invention, as illustrated in the accompanying drawings, wherein.

DETAILED DESCRIPTION OF THE PREFERRED EXEMPLARY EMBODIMENTS

Figure 2:
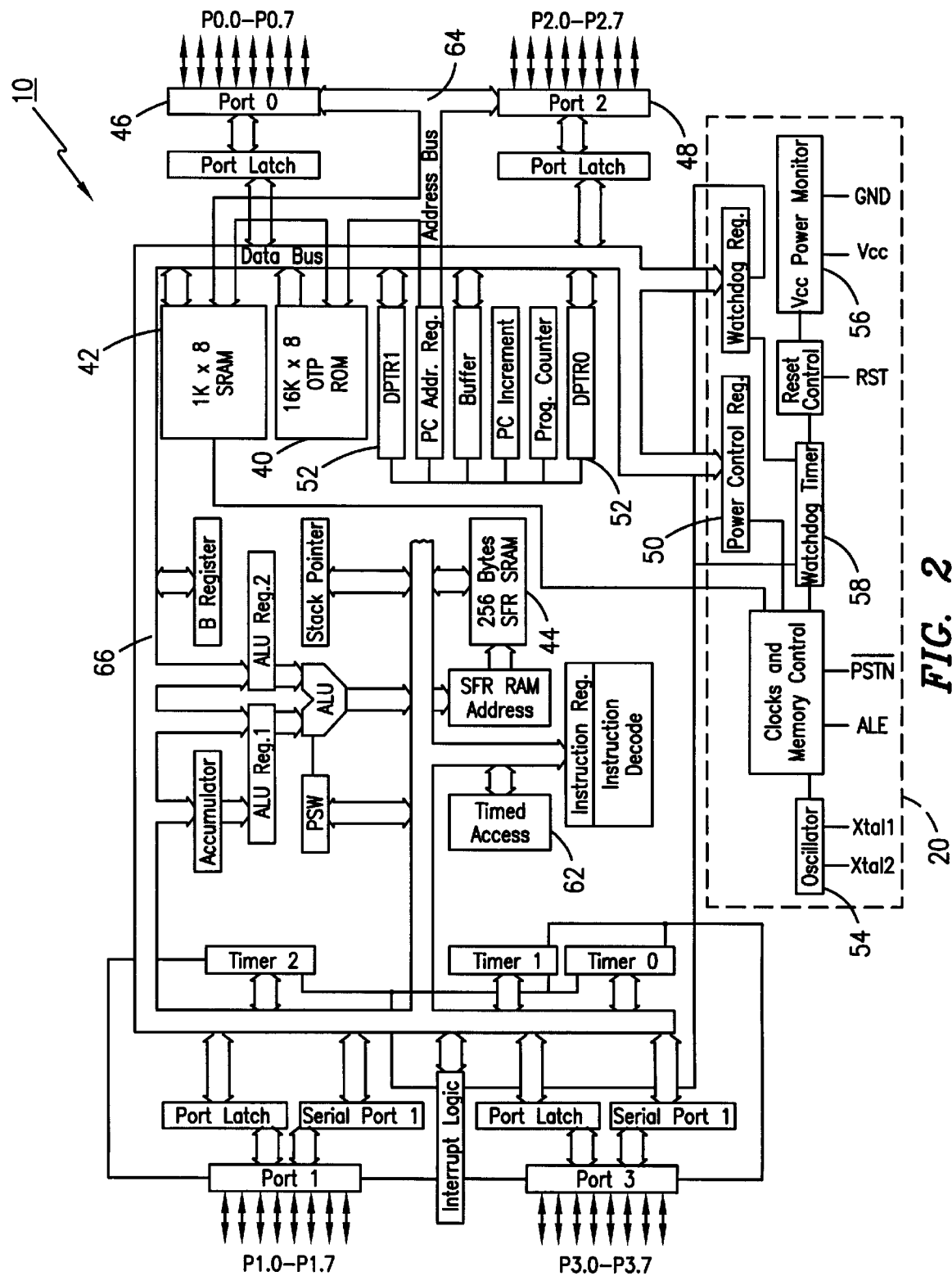
FIG. 2 is a system block circuit diagram of a preferred microcontroller.

Generally, at the outset, note that preferred exemplary embodiments of the microcontroller disclosed below provide one of the fastest 8051 compatible microcontrollers available. It features a redesigned processor core without wasted clock and memory cycles. FIG. 2 is a system block circuit diagram of a preferred embodiment of a microcontroller 100, which includes the enhanced circuitry portion 20 that provides for, among other things, the enhanced speed.

Preferred embodiments of the present microcontroller execute every 8051 instruction between 1.3 and 3 times faster than an ordinary 8051 microprocessor for the same crystal speed. Typical applications will see a speed improvement of 2.5 times using the same code and the same crystal.

Preferred embodiments offer a maximum crystal speed of 33 MHz, resulting in apparent execution speeds of 62.5 MHz (approximately 2.5×).

Figure 1A:
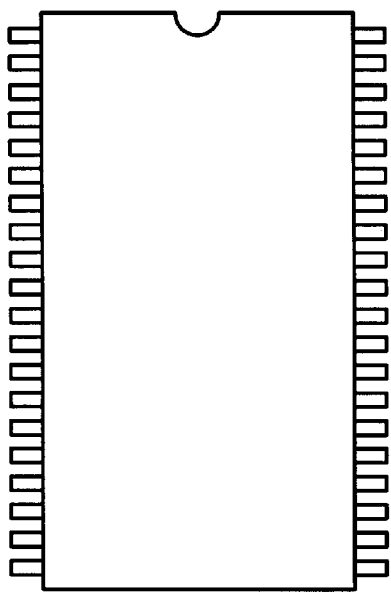
FIGS. 1A, 1B and 1C show diagrams of preferred pinouts of preferred system embodiments.
Figure 1B:
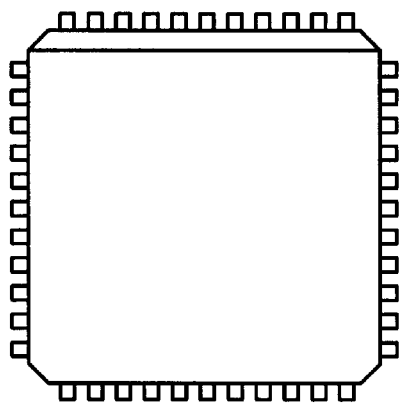
Figure 1C:
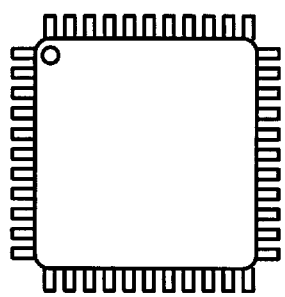

Preferred embodiments are pin compatible with all three packages of the standard 8051 and include standard resources such as 3 timer/counters, serial port, and four 8-bit I/O ports. It features 16K bytes of EPROM with an extra 1K byte of data RAM. Both OTP and windowed packages are available. FIGS. 1A, 1B and 1C show diagrams of preferred pin-outs of preferred system embodiments. Corresponding pin descriptions may be found in Chart 1 below:

TABLE 1

PIN DESCRIPTION

| DIP | PLCC | PQFP | NAME | DESCRIPTION |
|---|---|---|---|---|
| 40 | 44 | 38 | VCC | VCC - +5 V |
| 20 | 22, 23, 1 | 16, 17, 39 | GND | GND - Digital circuit ground |
| 9 | 10 | 4 | RST | RST - Input. The RST input pin contains a Schmitt voltage input to recognize external active high Reset inputs. The pin also employs an internal pull-down resistor to allow for a combination of wired OR external Reset sources. An RC is not required for power-up, as the DS87C520 provides this function internally. |
| 18 | 20 | 14 | XTAL2 | XTAL1, XTAL2 - The crystal oscillator pins XTAL1 and XTAL2 provide support for parallel resonant, AT cut crystals, XTAL1 acts also as an input if there is an external clock source in place of a crystal. XTAL2 serves as the output of the crystal amplifier. |
| 19 | 21 | 15 | XTAL1 | |
| 29 | 32 | 26 | PSEN\ | PSEN\ - Output. The Program Store Enable output. This signal is commonly connected to optional external ROM memory as a chip enable. PSEN\ will provide an active low pulse and is driven high when external ROM is not being accessed. |
| 30 | 33 | 27 | ALE | ALE - Output. The Address Latch Enable output functions as a clock to latch the external address LSB from the multiplexed address/data bus on Port 0. This signal is commonly connected to the latch enable of an external 373 family transparent latch. ALE has a pulse width of 1.5 XTAL1 cycles and a period of 4 XTAL1 cycles. ALE is forced high when the DS87C520 is in a Reset condition. ALE can also be disabled using the EMI reduction mode. |
| 39 | 43 | 37 | P0.0 | Port 0 (AD0-7) - I/O. Port 0 is an open-drain 8-bit bi-directional I/O port. As an alternate function Port 0 can function as the multiplexed address/data bus to access, off-chip memory. During the time when ALE is high, the LSB of a memory address is presented. When ALE falls to a logic 0, the port transitions to a bi-directional data bus. This bus is used to read external ROM and read/write external ROM memory or peripherals. When used as a memory bus, the port provides active high drivers. The reset condition of Port 0 is tri-state. Pull-up resistors are required when using Port 0 as an I/O port. |
| 38 | 42 | 36 | P0.1 | |
| 37 | 41 | 35 | P0.2 | |
| 36 | 40 | 34 | P0.3 | |
| 35 | 39 | 33 | P0.4 | |
| 34 | 38 | 32 | P0.5 | |
| 33 | 37 | 31 | P0.6 | |
| 32 | 36 | 30 | P0.7 | |
| 1–8 | 2–9 | 40–44 1–3 | P1.0– P1.7 | Port 1 - I/O. Port 1 functions as both an 8-bit bi-directional I/O port and an alternate functional interface for Timer 2 I/O, new External Interrupts, and new Serial Port 1. The reset condition of Port 1 is with all bits at a logic 1. In this state, a weak pull-up holds the port |

TABLE 1-continued

PIN DESCRIPTION

| DIP | PLCC | PQFP | NAME | DESCRIPTION |
|---|---|---|---|---|
| | | | | high. This condition also serves as an input mode, since any external circuit that writes to the port will overcome the weak pull-up. When software writes a 0 to any port pin, the DS87C520 will activate a strong pull-down that remains on until either a 1 is written or a reset occurs. Writing a 1 after the port has been at 0 will cause a strong transition driver to turn on, followed by a weaker sustaining pull-up. Once the momentary strong driver turns off, the port again becomes the output high (and input) state. The alternate modes of Port 1 are outlined as follows. |
| | | | Port | Alternate Function |
| 1 | 2 | 40 | P1.0 T2 | External I/O for Timer/Counter 2 |
| 2 | 3 | 41 | P1.1 T2EX | Timer/Counter 2 Capture/Reload Trigger |
| 3 | 4 | 42 | P1.2 RXD1 | Serial Port 1 Input |
| 4 | 5 | 43 | P1.3 TXD1 | Serial Port 1 Output |
| 5 | 6 | 44 | P1.4 INT2 | External Interrupt 2 (Positive Edge Detect) |
| 6 | 7 | 1 | P1.5 INT3\ | External Interrupt 3 (Negative Edge Detect) |
| 7 | 8 | 2 | P1.6 INT4 | External Interrupt 4 (Positive Edge Detect) |
| 8 | 9 | 3 | P1.7 INT5\ | External Interrupt 5 (Negative Edge Detect) |
| 21 | 24 | 18 | P2.0 | Port 2(AB-16) - I/O. Port 2 is a bi-directional I/O port. The reset condition of Port 2 is logic high. In this state, a weak pull-up holds the port high. This condition also serves as an input mode, since any external circuit that writes to the port will overcome the weak pull-up. When software writes an 0 to any port pin, the DS87C520 will activate a strong pull-down that remains on until either a 1 is written or a reset occurs. Writing a 1 after the port has been at 0 will cause a strong transition driver to turn on, followed by weaker sustaining pull-up. Once the momentary strong driver turns off, the port again becomes both the output high and input state. As an alternate function Port 2 can function as MSB of the external address bus. This bus can be used to read external ROM and read/write external RAM memory or peripherals. |
| 22 | 25 | 19 | P2.1 | |
| 23 | 26 | 20 | P2.2 | |
| 24 | 27 | 21 | P2.3 | |
| 25 | 28 | 22 | P2.4 | |
| 26 | 29 | 23 | P2.5 | |
| 27 | 30 | 24 | P2.6 | |
| 28 | 31 | 25 | P2.7 | |
| 10–17 | 11, 13–19 | 5, 7–13 | P3.0– P3.7 | Port 3 - I/O. Port 3 functions as both an 8-bit bi-directional I/O port and an alternate functional interface for External Interrupts, Serial Port 0, Timer 0 & 1 Inputs, and RD\ and WR\ strobes. The reset condition of Port 3 is with all bits at a logic 1. In this state, a weak pull-up holds the port high. This condition also serves as an input mode, since any external circuit that writes to the port will overcome the weak pull-up. When software writes a 0 to any port |

TABLE 1-continued

PIN DESCRIPTION

| DIP | PLCC | PQFP | NAME | DESCRIPTION |
|-----|------|------|------|-------------|
|     |      |      |      | pin, the DS87C520 will activate a strong pull-down that remains on until either a 1 is written or a reset occurs. Writing a 1 after the port has been at 0 will cause a strong transaction driver to turn on, followed by a weaker sustaining pull-up. Once the momentary strong driver turns off, the port again becomes both the output high and input state. The alternate modes of Port 3 are outlined below. |
|     |      |      |      | Port         Alternate Mode |
| 10  | 11   | 5    |      | P3.0   RXD0   Serial Port 0 Input |
| 11  | 13   | 7    |      | P3.1   TXD0   Serial Port 0 Output |
| 12  | 14   | 8    |      | P3.2   INT0\  External Interrupt 0 |
| 13  | 15   | 9    |      | P3.3   INT1\  External Interrupt 1 |
| 14  | 16   | 10   |      | P3.4   T0     Timer 0 External Input |
| 15  | 17   | 11   |      | P3.5   T1     Timer 1 External Input |
| 16  | 18   | 12   |      | P3.6   WR\    External Data Memory Write Strobe |
| 17  | 19   | 13   |      | P3.7   RD\    External Data Memory Read Strobe |
| 31  | 35   | 29   | EA\  | EA\ - Input. Connect to ground to force the DS87C520 to use an external ROM. The internal RAM is still accessible as determined by register settings. Connect EA\ to VCC to use internal ROM. |
| —   | 12   | 6    | NC   | NC - Reserved. These pins should not be connected. They are reserved for use with future devices in this family. |
|     | 34   | 28   |      |             |

Besides greater speed, preferred embodiments may comprise a second serial port, seven additional interrupts, a programmable watchdog timer, a brown-out monitor, and power-fail reset circuitry.

Preferred embodiments are also fully static CMOS 8051 compatible microcontrollers designed for high performance. In most cases, preferred embodiments can be placed into an existing socket for the 80C51, 80C52, 87C51, or 87C52 to improve the overall circuit operation significantly. While remaining familiar to 8051 family users, the present exemplary microcontroller has many new features. In general, software written for existing 8051 based systems works without modification on preferred system embodiments. the exception to this is that critical timing functions may not operate correctly since the High Speed Micro performs its instructions much faster than the Standard 8051 for any given crystal selection. Preferred embodiments run the standard 8051 family instruction set and is pin compatible with DIP, PLCC or QFP packages.

Preferred embodiments of the present microcontroller provide three 16-bit timer/counters, full-duplex serial port (2), 256 bytes of direct RAM plus 1K bytes of extra MOVX RAM. I/O ports have the same operation as a standard 8051 product. Timers default to a 12 clock per cycle cooperation to keep their timing compatible with original 8051 family systems. However, timers are individually programmable to run at the new 4 clocks per cycle if desired.

Preferred embodiments provide several new hardware features implemented by new Special Function Registers (SFRs). A summary of these SFRs is provided below.

Regarding the performance overview, preferred embodiments feature a high speed 8051 compatible core. Higher speed comes not just from increasing the clock frequency, but from a newer, more efficient design.

This updated core does not have the dummy memory cycles that are present in a standard 8051. A standard 8051 generates machine cycles using the clock frequency divided by 12. In preferred embodiments, the same machine cycle takes 4 clocks. Thus the fastest instruction, 1 machine cycle, executes 3 times faster for the same crystal frequency. Note that these are for identical instructions. The majority of instructions on preferred embodiments of the present invention will see the full 3 to 1 speed improvement. Some instructions will get between 1.5 and 2.4 speed improvement. All instructions are faster than the original 8051.

The numerical average of all opcodes gives approximately a 2.5 to 1 speed improvement. Improvement of individual programs will depend on the actual instructions used. Speed sensitive applications would make the most use of instructions that are 3 times faster. However, the sheer number of 3 to 1 improved opcodes makes dramatic speed improvements likely for any code. These architecture improvements and $0.8\mu$ CMOS produce a peak instruction cycle in 121 nS (8.25 MIPs). The Dual Data Pointer feature also allows the user to eliminate wasted instructions when moving blocks of memory.

Regarding the Instruction Set Summary, all instructions in preferred embodiments perform the same functions as their 8051 counterparts. Their effect on bits, flags, and other status functions is identical. However, the timing of each instruction is different. This applies both in absolute and relative number of clocks.

Counter/timers default to run at the older 12 clocks per increment. In this way, timer-based events occur at the standard intervals with software executing at higher speed. Timers optionally can run at 4 clocks per increment to take advantage of faster processor operation.

The relative time of two instructions might be different in the new architecture. For example, in the original architecture, the "MOVX A, @DPTR" instruction and the "MOV direct, direct" instruction used two machine cycles or 24 oscillator cycles. Therefore, they required the same amount of time. In preferred embodiments, the MOVX instruction takes as little as two machine cycles or 8 oscillator cycles but the "MOV direct, direct" uses three machine cycles or 12 oscillator cycles. While both are faster than their original counterparts, they now have different execution times. This is because preferred embodiments usually use one machine instruction cycle for each instruction byte.

Regarding the Special function Registers ("SFRs"), SFRs control most special features of preferred embodiments. This allows preferred embodiments to have many new features but use the same instruction set as an 8051. When writing software to use a new feature, an equate statement defines the SFR to an assembler or compiler. This is the only change needed to access the new function. Preferred embodiments duplicate the SFRs contained in the standard 80C52. Table 2 shown below shows the register addresses and bit locations. Many are standard registers.

TABLE 2

SPECIAL FUNCTION REGISTER LOCATIONS

| REGISTER | BIT7 | BIT6 | BIT5 | BIT4 | BIT3 | BIT2 | BIT1 | BIT0 | ADD. |
|---|---|---|---|---|---|---|---|---|---|
| PORT 0 | P0.7 | P0.6 | P0.5 | P0.4 | P0.3 | P0.2 | P0.1 | P0.0 | 80h |
| STACK POINTER | | | | | | | | | 81h |
| DPL | | | | | | | | | 82h |
| DPH | | | | | | | | | 83h |
| DPL1 | | | | | | | | | 84h |
| DPH1 | | | | | | | | | 85h |
| DPS | 0 | 0 | 0 | 0 | 0 | 0 | 0 | SEL | 86h |
| PCON | SMOD | SMOD0 | — | — | GF1 | GF0 | STOP | IDLE | 87h |
| TCON | TF1 | TR1 | TF0 | TR0 | IE1 | IT1 | IE0 | IT0 | 88h |
| TMOD | GATE | C/T\ | M1 | M0 | GATE | C/T\ | M1 | M0 | 89h |
| TL0 | | | | | | | | | 8Ah |
| TL1 | | | | | | | | | 8Bh |
| TH0 | | | | | | | | | 8Ch |
| TH1 | | | | | | | | | 8Dh |
| CKCON | WD1 | WD0 | T2M | T1M | T0M | MD2 | MD1 | MD0 | 8Eh |
| PORT1 | P1.7 | P1.6 | P1.5 | P1.4 | P1.3 | P1.2 | P1.1 | P1.0 | 90h |
| EXIF | IE5 | IE4 | IE3 | IE2 | XT/RG | RGMD | RGSL | BGS | 91h |
| SCON0 | SM0/FE | SM1 | SM2 | REN | TB8 | RB8 | T1 | R1 | 98h |
| SBUF0 | SB7 | SB6 | SB5 | SB4 | SB3 | SB2 | SB1 | SB0 | 99h |
| PORT 2 | P2.7 | P2.6 | P2.5 | P2.4 | P2.3 | P2.2 | P2.1 | P2.0 | A0h |
| IE | EA | ES1 | ET2 | ES0 | ET1 | EX1 | ET0 | EX0 | A8h |
| SADDR0 | | | | | | | | | A9h |
| SADDR1 | | | | | | | | | AAH |
| PORT3 | P3.7 | P3.6 | P3.5 | P3.4 | P3.3 | P3.2 | P3.1 | P3.0 | B0 |
| IP | — | PS1 | PT2 | PS0 | PT1 | PX1 | PT0 | PX0 | B8h |
| SADEN0 | | | | | | | | | B9h |
| SADEN1 | | | | | | | | | BAH |
| SCON1 | SM0/FE | SM1 | SM2 | REN | TB8 | RB8 | T1 | R1 | C6–0h |
| SBUF1 | SB7 | SB6 | SB5 | SB4 | SB3 | SB2 | SB1 | SB0 | C1h |
| ROMSIZE | — | — | — | — | — | RS2 | RS1 | RS0 | C2h |
| PMR | CD1 | CD0 | SWB | — | XTOFF | ALEOFF | DME1 | DME0 | C4h |
| STATUS | PIP | HIP | LIP | XTUP | SPTA1 | SPRA1 | SPTA0 | SPRA0 | C5h |
| TA | | | | | | | | | C7h |
| T2CON | TF2 | EXF2 | RCLK | TCLK | EXEN2 | TR2 | C/T2\ | CP/RL2 | C8h |
| T2MOD | — | — | — | — | — | — | T2CE | DCEN | C9h |
| RCAP2L | | | | | | | | | CAh |
| RCAP2H | | | | | | | | | CBh |
| TL2 | | | | | | | | | CCh |
| TH2 | | | | | | | | | CDh |
| PSW | CY | AC | F0 | RS1 | RS0 | OV | FL | P | D0h |
| WDCON | SMOD | POR | EPF2 | FF2 | WDIF | WTRF | EWT | RWT | Dah |
| ACC | | | | | | | | | E0h |
| EIE | — | — | — | EWD1 | EX5 | EX4 | EX3 | WX2 | E8h |
| B | | | | | | | | | F0h |
| EIP | — | — | — | PWD1 | PX5 | PX4 | PX3 | PX2 | F8h |

*New Functions in Bold

Referring to FIG. 2 and regarding memory resources, like the 8051, preferred embodiments use three memory areas. These are program (ROM), data (RAM), and scratchpad RAM (registers). Preferred embodiments contain on-chip quantities of all three areas.

The total memory configuration of preferred embodiments is 16K bytes of ROM 40, 1K byte of data SRAM 42 and 256 bytes of scratchpad or direct RAM 44. The 1K byte of data space SRAM 42 is read/write accessible and is memory mapped. This on-chip SRAM is reached by the MOVX instruction. It is not used for executable memory. The scratchpad area is 256 bytes of register mapped RAM 44 and is identical to the RAM found on preferred embodiments. There is no conflict or overlap among the 256 bytes and the 1K as they "use" or "are accessed by" different addressing modes and separate instructions.

Regarding program memory access, on-chip ROM 40 begins at address 0000h and is contiguous through 3FFFh (16K). Exceeding the maximum address of on-chip ROM will cause preferred embodiments to access off-chip memory. However, the maximum on-chip decoded address is selected by software using the ROMSIZE feature. Software can cause preferred embodiments to behave like a device with less on-chip memory. This is beneficial when overlapping external memory, such as FLASH, is used.

The maximum memory size is dynamically variable. Thus, a portion of memory can be removed from the memory map to access off-chip memory, then restored to access on-chip memory. In fact, all of the on-chip memory can be removed from the memory map allowing the full 64K memory space to be addressed from off-chip memory. ROM addresses that are larger than the selected maximum are automatically fetched from outside the part via Ports 0 & 2.

ROMSIZE register is used to select the maximum on-chip decoded address of ROM. Bits RS2, RS1, RS0 have the following effect.

| RS2 | RS1 | RS0 | Maximum on-chip ROM Address |
|---|---|---|---|
| 0 | 0 | 0 | 0K |
| 0 | 0 | 1 | 1K |
| 0 | 1 | 0 | 2K |
| 0 | 1 | 1 | 4K |
| 1 | 0 | 0 | 8K |
| 1 | 0 | 1 | 16K (default) |
| 1 | 1 | 0 | Invalid - reserved |
| 1 | 1 | 1 | Invalid - reserved |

The reset default condition is a maximum on-chip ROM address of 16K bytes. Thus, no action is required if this feature is not used. Thus when accessing external program memory, the first 16K bytes would be inaccessible. To select a smaller effective ROM size, software must alter bits RS2-RS0. Altering these bits requires a Timed Access procedure as explained below.

The ROMSIZE register should be manipulated from a safe area in the program memory map. This is a program memory address that will not be affected by the change. For example, one should not select a maximum ROM size of 4K from an internal ROM address of 5K. This would cause a current address to switch from internal to external and cause invalid operation. Similarly, one should not instantly switch from external to internal memory. For example, do not select a maximum ROM address of 16K from an external ROM address of 12K.

Off-chip memory is accessed using the multiplexed address/data bus on P0 and the MSB address of P2. While serving as a memory bus, these pins are not I/O ports. This convention follows the standard 8051 method of expanding on-chip memory. Off-chip ROM access also occurs if an EA\ pin is a logic 0. The EA\ overrides all bit settings. The PSEN\ signal will go active (low) to serve as a chip enable or output enable when Ports 0 & 2 fetch from external ROM.

Regarding data memory access, unlike many 8051 derivatives, preferred embodiments contain on-chip data memory. It also contains the standard 256 bytes of RAM accessed by direct instructions. These areas are separate. The MOVX instructions access the on-chip data memory. Although physically on-chip, software treats this area as though it was located off-chip. The 1K byte of SRAM is between address 000h and 03FFh.

Access to the on-chip data RAM 42 is optional under software control. When enabled by software, the data SRAM is between 000h and 03FFh. Any MOVX instruction that uses this area will go to the on-chip RAM while enabled. MOVX addresses greater than 1K automatically go to external memory through Ports 0 & 2.

When disabled, the 1K SRAM memory area 42 is transparent to the system memory map. Any MOVX directed to the space between 0000h and FFFFh goes to the expanded bus on Ports 0 & 2 (46, 48). This also is the default condition. This default allows preferred embodiments to drop into an existing system that uses these addresses for other hardware and still have full compatibility.

The on-chip data area is software selectable using two bits in the Power Management Register 50 at location C4h. This selection is dynamically programmable. Thus access to the on-chip area becomes transparent to reach off-chip devices at the same addresses. The control bits are DME1 (PMR.1) and DME0 (PMR.0). They have the following operation:

TABLE 3

DATA MEMORY ACCESS CONTROL

| DME1 | DME0 | Data Memory Address | Memory Function |
|---|---|---|---|
| 0 | 0 | 0000h-FFFFh | External Data Memory *Default Condition |
| 0 | 1 | 0000h-03FFh | Internal SRAM Data Memory |
|   |   | 0400h-FFFFh | External Data Memory |
| 1 | 0 | Reserved |  |
| 1 | 1 | 0000h-03FFh | Internal SRAM Data Memory |
|   |   | 0400h-FFFBh | Reserved-no external access |
|   |   | FFFCh | Read access to the status of lock bits |

Regarding the stretch memory cycle, preferred embodiments allow software to adjust the speed of off-chip data memory access. The micro is capable of performing the MOVX in as little as two instruction cycles. The on-chip SRAM 42 uses this speed and any MOVX instruction directed internally uses two cycles. However, the time can be stretched for interface to external devices. This allows access to both fast memory and slow memory or peripherals with no glue logic. Even in high-speed systems, it may not be necessary or desirable to perform off-chip data memory access at full speed. In addition, there is a variety of memory mapped peripherals such as LCDs or UARTs that are slow.

The Stretch MOVX is controlled by the Clock Control Register at SFR location 8Eh as described below. It allows the user to select a Stretch value between zero and seven. A stretch of zero will result in a two machine cycle MOVX. A Stretch of seven will result in a MOVX of nine machine cycles. Software can dynamically change this value depending on the particular memory or peripheral.

On reset, the Stretch value will default to a one resulting in a three cycle MOVX for an external access. Therefore, off-chip RAM access is not at full speed. This is a convenience to existing designs that may not have fast RAM in place. Internal SRAM access is always at full speed regardless of the Stretch setting. When desiring maximum speed, software should select a Stretch value of zero. When using very slow RAM or peripherals, select a larger Stretch value. Note that this affects data memory only and the only way to slow program memory (ROM) access is to use a slower crystal.

Using a Stretch value between one and seven causes the microcontroller to Stretch and read/write strobe and all related timing. Also, setup and hold times are increased by 1 clock when using a Stretch greater than 0. This results in a longer read/write strobe and relaxed interface timing, allowing more time for memory/peripherals to respond. The timing of the variable speed MOVX is in the Electrical Specifications. Table 4 below shows the resulting strobe widths for each Stretch value. The memory Stretch uses the Clock Control Special Function Register at SFR location 8Eh. The Stretch value is selected using bits CKCON.2-0. In the table, these bits are referred to as M2 through M0. The first Stretch (default) allows the use of common 120 nS RAMs without dramatically lengthening the memory access. See Table 4.

TABLE 4

DATA MEMORY CYCLE STRETCH VALUES

| CKCON. 2-0 | | | MEMORY CYCLES | RD/ or WR/ STROBE WIDTH IN CLOCKS | STROBE WIDTH TIME @ 33 MHz |
|---|---|---|---|---|---|
| M2 | M1 | M0 | | | |
| 0 | 0 | 0 | 2 (forced internal) | 2 | 60 nS |
| 0 | 0 | 1 | 3 (default external) | 4 | 121 nS |
| 0 | 1 | 0 | 4 | 8 | 242 nS |
| 0 | 1 | 1 | 5 | 12 | 364 nS |
| 1 | 0 | 0 | 6 | 16 | 485 nS |
| 1 | 0 | 1 | 7 | 20 | 606 nS |
| 1 | 1 | 0 | 8 | 24 | 727 nS |
| 1 | 1 | 1 | 9 | 28 | 848 nS |

Regarding the dual data pointers, the timing of block moves of data memory is faster using Dual Data Pointer (DPTR) 52. The standard 8051 DPTR is a 16-bit value that is used to address off-chip data RAM or peripherals. In preferred embodiments, this data pointer is called DPTR0, located at SFR addresses 82h and 83h. These are the original locations. Using DPTR0 requires no modification of standard code. The new DPTR at SFR 84h and 85h is called DPTR1. The DPTR Select bit (DPS) chooses the active pointer. Its location is the 1 sb of the SFR location 86h. No other bits in register 86h have any effect and are 0. The user switches between data pointers by toggling the 1 sb of register 86h. The increment (INC) instruction is the fastest way to accomplish this. All DPTR-related instructions use the currently selected DPTR for any activity. Therefore it takes only one instruction to switch from a source to a destination address. Using the Dual Data Pointer saves code from needing to save source and destination addresses when doing a block move. The software simply switches between DPTR0 and DPTR1 52 once software loads them. The relevant register locations are as follows:

| | | |
|---|---|---|
| DPL0 | 82h | Low byte original DPTR |
| DPH0 | 83h | High byte original DPTR |
| DPL1 | 85h | Low byte new DPTR |
| DPH1 | 85h | High byte new DPTR |
| DPS | 86h | DPTR Select (1sb) |

Regarding power management circuitry, along with the standard IDLE and power down (STOP) modes of the standard referred embodiments, preferred embodiments provided a new Power Management Mode. This mode allows the processor to continue functioning, yet to save power compared with full operation. Preferred embodiments also feature several enhancements to STOP mode that make it more useful.

Regarding the power management mode (PMM), power management mode offers a complete scheme of reduced internal clock speeds that allow the CPU to run software and use substantially less power. During default operation, preferred embodiments use 4 clocks per machine cycle. Thus the instruction cycle rate is Clock/4. At 33 MHz crystal speed, the instruction cycle speed is 8.25 MHz (33/4). In PMM, the microcontroller continues to operate but uses an internally divided version of the clock source. This creates a lower power state without external components. It offers a choice of two reduced instruction cycle speeds (and two lock sources—discussed below). The speeds are (Clock/64) and (Clock/1024).

PMM is preferably invoked via software. Table 5 illustrates the instruction cycle rate in PMM for several common crystal frequencies. Since power consumption is a direct function of operating speed, PMM1 eliminates most of the power consumption while still allowing a reasonable speed of processing. PMM2 runs very slowly and provides the lowest power consumption without stopping the CPU. This is illustrated in Table 6.

TABLE 5

INSTRUCTION CYCLE RATE

| Crystal Speed | Full Operation (4 clocks) | PMM 1 (64 clocks) | PMM 2 (1024 clocks) |
|---|---|---|---|
| 1.8432 MHz | 460.8 KHZ | 28.8 KHZ | 1.8 KHZ |
| 11.0592 MHz | 2.765 MHz | 172.6 KHZ | 10.8 KHZ |
| 22 MHz | 5.52 MHz | 345.6 KHZ | 21.6 KHZ |
| 25 MHz | 6.25 MHz | 390.6 KHZ | 24.4 KHZ |
| 33 MHz | 8.25 MHz | 515.6 KHZ | 32.2 KHZ |

Note that PMM provides a lower power condition than IDLE mode. This is because in IDLE, all clocked functions such as timers run at a rate of crystal divided by 4. Since wake-up from PMM is as fast as or faster than from IDLE and PMM allows the CPU to operate (even if doing NOPs), there is little reason to use IDLE in new designs.

TABLE 6

OPERATING CURRENT ESTIMATES IN PMM

| Crystal Speed | Full Operation (4 clocks) | PMM 1 (64 clocks) | PMM 2 (1024 clocks) |
|---|---|---|---|
| 1.8432 MHz | 3.1 mA | 1.2 mA | 1.0 mA |
| 3.56 MHz | 5.3 mA | 1.6 mA | 1.1 mA |
| 11.0592 MHz | 15.5 mA | 4.8 mA | 4.0 mA |
| 16 MHz | 21 mA | 7.1 mA | 6.0 mA |
| 22 MHz | 25.5 mA | 8.3 mA | 6.5 mA |
| 25 MHz | 31 mA | 9.7 ma | 8.0 mA |
| 33 MHz | 36 mA | 12.0 mA | 10.0 mA |

Regarding Crystalless PMM, a major component of power consumption in PMM is the crystal amplifier circuit. Preferred embodiments allow the user to switch CPU operation to an internal ring oscillator and turn off the crystal amplifier. The CPU then has a clock source of approximately 4 MHz, divided by either 4, 64, or 1024. The ring is not accurate so software cannot perform precision timing. However, this mode allows an additional saving of between 0.5 and 6.0 mA depending on the actual crystal frequency. While this saving is of little use when running at 4 clocks per instruction cycle, it makes a major contribution when running in PMM1 or PMM2.

Regarding PMM operation, software invokes the PMM by setting the appropriate bits in the SFR area. The basic choices are divider speed and clock source. There are three speeds (4, 64, 1024) and two clock sources (crystal, ring). Both the decisions and the controls are separate. Software will typically select the clock speed first. Then, it will perform the switch to ring operation if desired. Lastly, software can disable the crystal amplifier if desired.

There are two ways of exiting PMM. Software can remove the condition by reversing the procedure that invoked PMM, or hardware can (optionally) remove it. To resume operation at a divide by 4 rate under software control, simply select 4 clocks per cycle, then crystal based operation if relevant. When disabling the crystal as the timebase in favor of the ring oscillator, there are timing restrictions associated with restarting the crystal operation. Details are described below.

There are three registers containing bits that are concerned with PMM functions. They are Power Management Register 50 (PMR; C4h), Status (STAT; C5h), and External Interrupt Flag (EXIF; 91h).

Regarding Clock Divider, software can select the instruction cycle rate by selecting bits CD1 (PMR.7) and CD0 (PMR.6) as follows:

| CD1 | CD0 | Cycle Rate |
|-----|-----|------------|
| 0 | 0 | Reserved |
| 0 | 1 | 4 clocks (default) |
| 1 | 0 | 64 clocks |
| 1 | 1 | 1024 clocks |

The selection of instruction cycle rate will take effect after a delay of one machine cycle. Note that the clock divider choice applies to all functions including timers. Since baud rates are altered, it will be difficult to conduct serial communication while in PMM. There are minor restrictions on accessing the clock selection bits. The processor must be running in a 4 clock state to select either 64 (PMM1) or 1024 (PMM2) clocks. This means software cannot go directly from PMM1 to PMM2 or vice versa. It must return to a 4 clock rate first.

Regarding Switchback, to return to a 4 clock rate from PMM, software can simply select the CD1 and CD0 clock control bits to the 4 clocks per cycle state. However, preferred embodiments provide several hardware alternatives for automatic Switchback. If Switchback is enabled, then preferred embodiments will automatically return to a 4 clock per cycle speed when an interrupt occurs from an enabled, valid external interrupt source. A Switchback will also occur when a UART detects the beginning of a serial start bit if the serial receiver is enabled. Note the beginning of a start bit does not generate an interrupt; this occurs on reception of a complete serial word. The automatic Switchback on detection of a start bit allows hardware to correct baud rates in time for a proper serial reception.

Switchback is enabled by setting the SWB bit (PMR.5) to a 1 in software. For an external interrupt, Switchback will occur only if the interrupt source could really generate the interrupt. For example, if INTO\ is enabled but has a low priority setting, then Switchback will not occur on INTO\ if the CPU is servicing a high priority Interrupt. A serial Switchback will occur only if the serial receiver function is enabled (REN=1).

When SWB=1, the user software will not be able to select a reduced clock mode if the UART is active. For example, the processor will prohibit the PMM by not allowing a write to CD1 and CD0 if a serial start bit arrived and SWB=1. Since the reception of a serial start bit or an interrupt priority lockout is normally undetectable by software in an 8051, the Status register features several new flags that are useful. These are described below.

Regarding the Status, information in the Status register assists decisions about switching into PMM. This register contains information about the level of active interrupts and the activity on the serial ports.

Preferred embodiments support three levels of Interrupt priority. These levels are Power-fail, High, and Low. Bits STAT.7-5 indicate the service status of each level. If PIP (Power-fail Interrupt Priority; STAT.7) is a 1, then the processor is servicing this level. If either HIP (High Interrupt Priority; STAT. 6) or LIP (Low Interrupt Priority; STAT.5) is high, then the corresponding level is in service.

Figure 3:
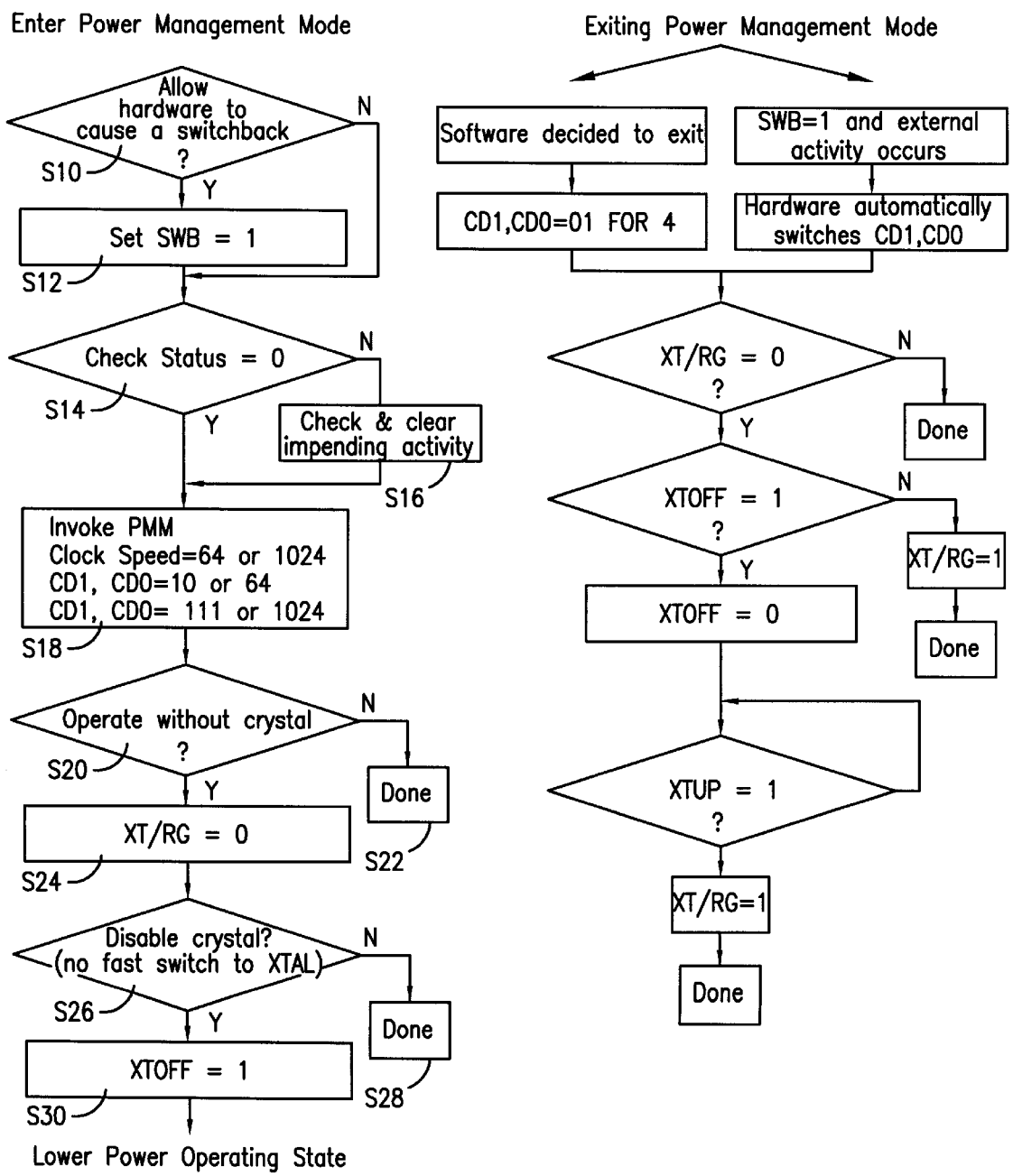
FIG. 3 is a flow chart showing the invoking and clearing of PMM.

Referring now to FIG. 3, software should not depend on a lower priority level interrupt source to remove PMM (Switchback) when the higher level is in service. Check the current priority service level before entering PMM. If the current service level locks out a desired Switchback source, then it would be advisable to wait until this condition clears before entering PMM.

Alternately, software can prevent an undesired exit from PMM by entering a low priority interrupt service level before entering PMM. This will prevent other low priority interrupts from causing a Switchback. See steps S10 and S12.

Status also contains information about the state of the serial ports. Serial Port Zero Receive Activity (SPRA0; STAT.0) indicates a serial word is being received on Serial Port 0 when this bit is set to a 1. Serial Port Zero Transmit Activity (SPTA0; STAT.1) indicates that the serial port is still shifting out a serial transmission. STAT.2 and STAT.3 provide the same information for Serial Port 1, respectively. While one of these bits is set, hardware prohibits software from entering PMM (CD1 and CD0 are write protected) since this would corrupt the corresponding serial transmissions. Thus, in steps S14 and S16, the status is checked and impending activity is cleared.

Regarding the Crystal/Ring Operation, preferred embodiments allow software to choose the clock source as an independent selection from the machine cycle rate. The uses can select crystal-based or ring oscillator-based operation under software control. FIG. 2 indicates connections for a crystal and the oscillator/ring oscillator block circuitry 54. Power-on reset default is the crystal (or external clock) source. The ring may save power depending on the actual crystal speed. To save still more power, software can then disable the crystal amplifier. This process requires two steps. Reversing the process also requires two steps. In FIG. 3 at step S18 PMM is invoked and the clock speed is selected.

Referring to steps S20 through S30, the XT/RG bit (EXIF.3) selects the crystal or ring as the clock source. Setting XT/RG=1 selects the crystal. Setting XT/RG=0 selects the ring, step S24. The RGMD (EXIF.2) bit serves as a status bit by indicating the active clock source. RGMD=0 indicates the CPU is running from the crystal. RGMD=1 indicates it is running from the ring. When operating from the ring, disable the crystal amplifier by setting the XTOFF bit (PMR.3) to a 1. This can only be done when XT/RG=0.

When changing the clock source, the selection will take effect after a one machine cycle delay. This applies to changes from crystal to ring and vice versa. However, this assumes that the crystal amplifier is running. In most cases, when the ring is active, software previously disabled the crystal to save power. If ring operation is being used and the system must switch to crystal operation, the crystal must first be enabled. Set the XTOFF bit to a 0. At this time, the crystal oscillation will begin. Preferred embodiments then provide a warm-up delay to make certain that the frequency is stable. Hardware will set the XTUP bit (STAT.4) to a 1 when the crystal is ready for use. Then software should write XT/RG to a 1 to begin operating from the crystal. Hardware prevents writing XT/RG to a 1 before XTUP=1. The delay between XTOFF=0 and XTUP=1 will be 65,536 crystal clocks. FIG. 3 flow charts also indicate an exemplary exit from PMM.

Switchback has no effect on the clock source. If software selects a reduced clock divider and enables the ring, a Switchback will only restore the divider speed. The ring will remain as the timebase until altered by software. If there is serial activity, Switchback usually occurs with enough time to create proper baud rates. This is not true if the crystal is off and the CPU is running from the ring. If sending a serial character that wakes the system from crystaless PMM, then it should be a dummy character of no importance with a subsequent delay for crystal startup.

Regarding the IDLE mode, setting the 1 sb of a Power Control register (PCON; 87h) invokes the IDLE mode. IDLE will leave internal clocks, serial ports and timers running. Power consumption drops because the memory is not being accessed. Since clocks are running, the IDLE power consumption is a function of crystal frequency. It should be approximately ½ of the power-on-power at a given frequency. The CPU can exit the IDLE state with any interrupt or a reset. IDLE is available for backward software compatibility. The system can now reduce power consumption to below IDLE levels by using PMM.

Regarding STOP mode enhancements, setting bit 1 of the Power Control register (PCON; 87h) invokes the STOP mode. STOP mode is the lowest power state since it turns off all internal clocking. The Icc of a standard STOP mode is approximately 1 uA. The exemplary CPU will exit STOP mode by an external interrupt or a reset condition. Internally generated interrupts (timer, serial port, watchdog) are not useful since they require clocking activity.

Preferred embodiments provide two enhancements to the STOP mode. As documented below, preferred embodiments provide a band-gap reference to determine Power-fail Interrupt and Reset thresholds. The default state is that the band-gap reference is off while in STOP mode. This allows the extremely low power state mentioned above. A user can optionally choose to have the band-gap enabled during STOP mode. With the band-gap reference enabled, PFI and Power-fail reset are functional and are valid means for leaving STOP mode. This allows software to detect and compensate for a brown-out or power supply sag, even when in STOP mode.

In STOP mode with the band-gap enabled, Icc will be approximately 100 uA computed with 1 uA with the band-gap off. If a user does not require a Power-fail Reset or Interrupt while in STOP mode, the band-gap can remain disabled. Only the most power sensitive applications should turn off the band-gap, as this results in an uncontrolled power down condition.

The second feature allows an additional power savings option while also making STOP easier to use. This is the ability to start instantly when exiting STOP mode. It is the internal ring oscillator that provides this feature. This ring can be a clock source when exiting STOP mode in response to an interrupt. The benefit of the ring oscillator is as follows.

Entering STOP mode turns off the crystal oscillator and all internal clocks to save power. This requires that the oscillator be restarted when exiting STOP mode. Actual start-up time is crystal dependent, but is normally at least 4 mS. A common recommendation is 10 mS. In an application that will wake-up, perform a short operation, then return to sleep, the crystal start-up can be longer than the real transaction. However, the ring oscillator will start instantly. Running from the ring, the user can perform a single operation and return to sleep before the crystal has even started. If a user selects the ring to provide the start-up clock and the processor remains running, hardware will automatically switch to the crystal once a power-on reset interval (65536 clocks) has expired. Hardware uses this value to assure proper crystal start even though power is not being cycled.

Figure 4:
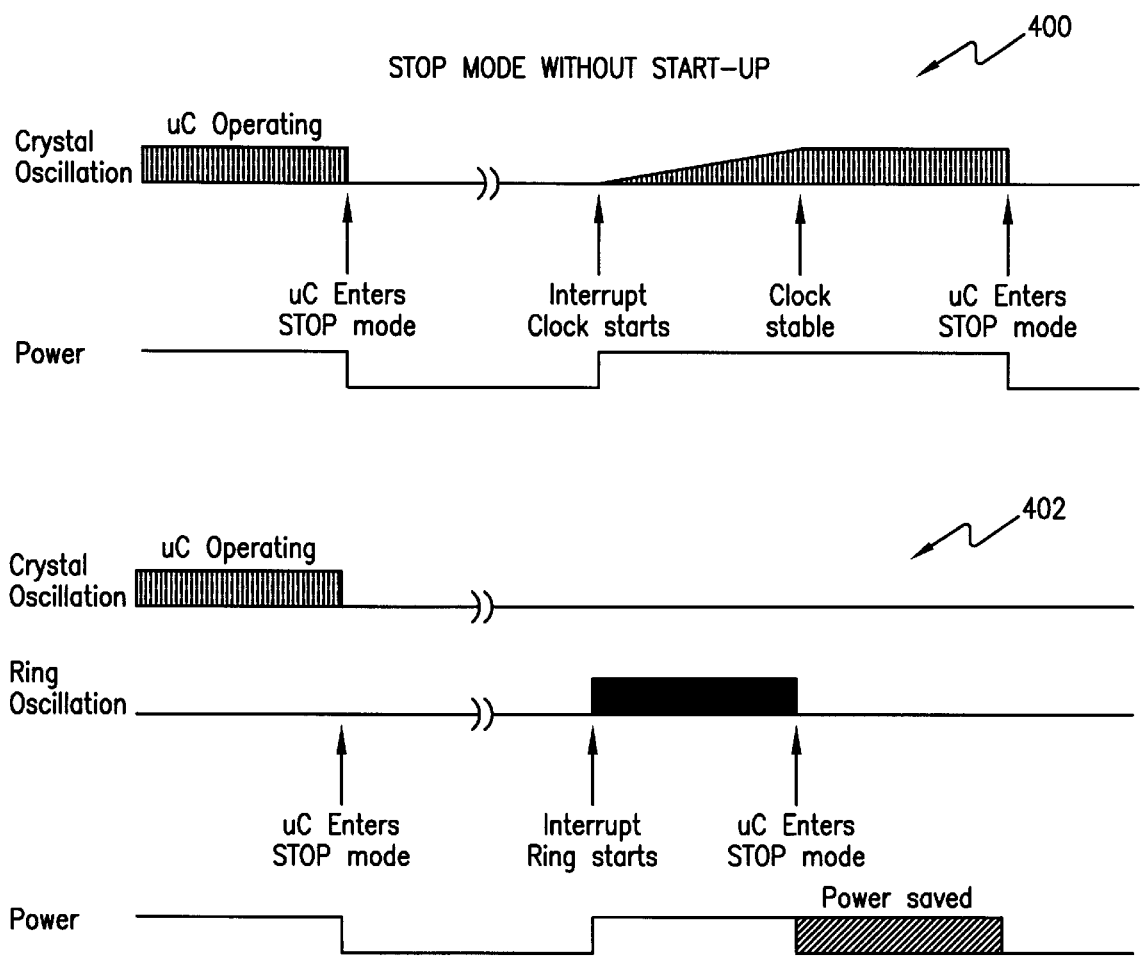
FIG. 4 is a timing diagram of a ring oscillator exit from stop mode.

The ring oscillator runs at approximately 4 MHz but will not be a precise value. Real-time precision operations (including serial communication) should not be conducted during a ring period. FIG. 4 provides a timing diagram comparing the time to initiate STOP mode with a crystal oscillator start-up 400 v. a ring oscillator start-up 402. Note that in the time it takes for the crystal oscillator to become stable in chart 400, the ring oscillator could have started performed the necessary timing clocks and stopped 402. The default state is to exit STOP mode without using the ring oscillator.

The RGSL—Ring Select bit at EXIF.1 (EXIF; 91h) controls this ring oscillator select function. When RGSL=1, the CPU will use the ring oscillator to exit STOP mode quickly. As mentioned above, the processor will automatically switch from the ring to the crystal after a delay of 65,536 crystal clocks. For a 3.57 MHz crystal, this is approximately 18 mS. The processor sets a flag called RGMD—Ring Mode, located at EXIF.2, that tells software that the ring is being used. The bit will be a logic 1 when the ring is in use. Attempt no serial communication or precision timing while this bit is set, since the operating frequency is not precise.

Preferred embodiments of the exemplary microcontroller provide several of the most commonly needed peripheral functions in microcomputer-based systems. These new functions include a second serial port, Power-fail Reset, Power-fail Interrupt, and a programmable Watchdog Timer. These are described below.

Regarding serial ports, preferred exemplary microcontrollers provide a serial port (UART). In addition, a preferred microcontroller includes a second hardware serial port. This second port optionally uses pins P1.2 (RXD1) and P1.3 (TXD1). It has control functions that are included in new SFR locations.

Both ports can operate simultaneously, but can operate at different baud rates or in different modes. The second serial port has similar control registers (SCON1 at C0h, SBUF1 at C1h) like the first port. The second serial port can only use Timer 1 for timer generated baud rates.

Regarding timer rate control, there is one important difference between preferred embodiments and a standard 8051 regarding timers. The standard 8051 uses 12 clocks per cycle for timers as well as for machine cycles. The preferred embodiment's architecture normally uses 4 clocks per machine cycle. However, in the area of timers and serial ports, a preferred embodiment will default to 12 clocks per cycle on reset. This allows existing code with real-time dependencies, such as baud rates, to operate properly.

If an application needs higher speed timers or serial baud rates, the user can select individual timers to run at the 4 clocks per cycle rate. The Clock Control register (CKCON; 8Eh) controls these timer speeds. When the relevant CKCON bit is a logic 1, a preferred embodiment uses 4 clocks per cycle to generate timer speeds. When the bit is a 0, a preferred embodiment uses 12 clocks for timer speeds. The reset condition is a 0. CKCON.5 selects the speed of Timer 2. CKCON.4 selects Timer 1 and CKCON.3 selects Timer 0. Note that unless a user desires very fast timing, it is unnecessary to alter these bits. Note that the timer controls are independent.

Regarding power-fail reset, a preferred embodiment uses a precision band-gap voltage reference to decide if VCC is out of tolerance. While powering up, an Internal monitor circuit (56, FIG. 2) maintains a reset state until VCC rises above the $V_{RST}$ level. Once above this level, the monitor enables the crystal oscillator and counts 65,536 clocks. It then exits the reset state. This power-on reset (POR) interval allows time for the oscillator to stabilize.

A system needs no external components to generate a power-related reset. Anytime VCC drops below $V_{RST}$, as in power failure or a power drop, the monitor 56 will generate and hold a reset. It occurs automatically, needing no action from the software.

Regarding the power-fail interrupt function, the voltage reference that sets a precise reset threshold also generates an optional early warning Power-fail Interrupt (PFI). When enabled by software, the processor will vector to RAM address 0033h if VCC drops below $V_{PFW}$. PFI has the highest priority. The PFI enable is in the Watchdog Control SFR (WDCON—D8h) (60 FIG. 2). Setting WDCON.5 to a logic 1 will enable the PFI. Application software can also read the PFI flag at WDCON.4. A PFI condition sets this bit to a 1. The flag is independent of the interrupt enable and software must manually clear it.

Regarding the Watchdog timer 58, to prevent software from losing control, preferred embodiments include a programmable Watchdog Timer 58. The Watchdog timer 58 is a free running timer that sets a flag if allowed to reach a preselected time-out. It can be (re)started by software.

A typical application is to select the flag as a reset source. When the Watchdog times out, it sets its flag which generates a reset. Software must restart the timer before it reaches its time-out or the processor is reset.

Software can select one of four time-out values. Then, it restarts the timer and enables the reset function. After enabling the reset function, software must then restart the timer before its expiration or hardware will reset the CPU. Both the Watchdog Reset Enable and the Watchdog Restart control bits are protected by a "Timed Access" circuit 62. This prevents errant software from accidentally clearing the Watchdog timer 58. Time-out values are precise since they are a function of the crystal frequency as shown below in TABLE 8. The time periods at 33 MHz also are shown.

TABLE 8

WATCHDOG TIME-OUT VALUES

| WD1 | WD0 | INTERRUPT TIME-OUT | TIME (33 MHz) | RESET TIME-OUT TIME (33 MHz) |
|---|---|---|---|---|
| 0 mS | 0 | $2^{17}$ clocks | 3.9718 mS | $2^{17}$ + 512 clocks 3.9874 |
| 0 mS | 1 | $2^{20}$ clocks | 31.77 mS | $2^{20}$ + 512 clocks 31.799 |
| 1 mS | 0 | $2^{23}$ clocks | 254.20 mS | $2^{23}$ + 512 clocks 254.21 |
| 1 mS | 1 | $2^{26}$ clocks | 2033.60 mS | $2^{26}$ + 512 clocks 2033.62 |

The Watchdog timer 58 also provides a useful option for systems that do not require a reset circuit. The Watchdog timer 58 will set an interrupt flag 512 clocks before setting the reset flag. Software can optionally enable this interrupt source. The interrupt is independent of the reset. A common use of the interrupt is during debug, to show developers where the Watchdog times out. This indicates where the Watchdog must be restarted by software The interrupt also can serve as a convenient time-base generator or can wake-up the processor.

The Watchdog function is controlled by the Clock Control (CKCON—8Eh), Watchdog Control (WDCON—D8h), and Extended Interrupt Enable (EIE—E8h) SFRs. CKCON.7 and CKCON.6 are WD1 and WD0 respectively and they select the Watchdog time-out period as shown in TABLE 8.

As shown above, the Watchdog Timer 58 uses the crystal frequency as a timebase. A user selects one of four counter values to determine the time-out. These clock counter lengths are $2^{17}$=131, 072 clocks; $2^{20}$=1,048,576 clocks; $2^{23}$=8,388,606 clocks; and $2^{26}$=67,108,864 clocks. The times shown in TABLE 8 above are for a 33 MHz crystal frequency. Once the counter chain has completed a full interrupt count, hardware will set an interrupt flag. Regardless of whether the user enables this interrupt, there are then 512 clocks left until the reset flag is set. Software can enable the interrupt and reset individually. Note that the Watchdog timer 58 is a free running timer and does not require an enable. There are five control bits in special function registers that affect the Watchdog Timer and two status flags that report to the user. One interrupt flag is set at timer termination when there are 512 clocks remaining until the reset flag is set. Another flag is set when the timer has completely timed out. This flag is normally associated with a CPU reset and allows software to determine the reset source. One control bit is the enable for the Watchdog timer reset function. A second control bit is for software used to restart the Watchdog Timer 58. Setting this second bit restarts the timer for another full interval. Application software must set this bit before the time-out. Both of these bits are protected by Timed Access 62. Two more bits select the time-out. Finally, a fifth bit enables the Watchdog Interrupt.

Regarding interrupts, preferred embodiments provide 13 interrupt sources with three priority levels. The Power-fail Interrupt (PFI) has the highest priority. Software can assign high or low priority to other sources. All interrupts that are new to the 8051 family, except for the PFI, have a lower natural priority than the standard 8051 interrupts.

TABLE 9

INTERRUPT SOURCES & PRIORITIES

| NAME | DESCRIPTION | VECTOR | NATURAL PRIORITY | 8051/ DALLAS |
|---|---|---|---|---|
| PFI | Power Fail Interrupt | 33h | 1 | DALLAS |
| INT0\ | External Interrupt 0 | 03h | 2 | 8051 |
| TF0 | Timer 0 | 0Bh | 3 | 8051 |
| INT1\ | External Interrupt 1 | 13h | 4 | 8051 |
| TF1 | Timer 1 | 1Bh | 5 | 8051 |
| SCON0 | TI0 or RI0 from serial port 0 | 23h | 6 | 8051 |
| TF2 | Timer 2 | 2Bh | 7 | 8051 |
| SCON1 | TI1 or TI1 from serial port 1 | 3Bh | 8 | DALLAS |
| INT2 | External Interrupt 2 | 42h | 9 | DALLAS |
| INT3\ | External Interrupt 3 | 4Bh | 10 | DALLAS |
| INT4 | External Interrupt 4 | 53h | 11 | DALLAS |
| INT5\ | External Interrupt 5 | 5Bh | 12 | DALLAS |
| WDTI | Watchdog Time-out Interrupt | 63h | 13 | DALLAS |

Regarding timed access functions 62 (FIG. 2), it is useful to protect certain SFR bits from an accidental writf operation. The Timed Access procedure stops an errant CPU from accidentally changing these bits. It requires that the following instructions precede a write of a protected bit.

MOV 0C7h, #0AAh

MOV 0C7h, #55h.

In an exemplary embodiment, writing an AAh then a 55h to the Timed Access register (location C7h) opens a 2 cycle window for write access. The window allows software to modify a protected bit(s). If these instructions do not immediately precede the write operation, then the write will not take effect. The protected bits are:

| | |
|---|---|
| EXIF.0 | BGS Band-gap Select |
| WDCON.6 | POR Power-on Reset flag |
| WDCON.1 | EWT Enable Watchdog Reset |

-continued

| | | |
|---|---|---|
| WDCON.0 | RWT | Restart Watchdog |
| WDCON.3 | WDIF | Watchdog Interrupt Flag |
| ROMSIZE.2 | RS2 | ROM size select 2 |
| ROMSIZE.1 | RS1 | ROM size select 1 |
| ROMSIZE.0 | RS0 | ROM size select 0 |

Regarding EPROM programming, preferred embodiments follow standards for a 16K byte EPROM version in the 8051 family. It is available in a UV erasable, ceramic windowed package and in plastic packages for one-time user-programmable versions. The part has unique signature information so EPROM programmers can support its specific EPROM options.

The Signature bytes identify the product and programming revision to EPROM programmers. This information is at programming addresses 30h, 31h, and 60h. This information is as follows:

| Address | Value | Meaning |
|---|---|---|
| 30h | DAh | Manufacturer |
| 31h | 20h | Model |
| 60h | 01h | Extension |

Figure 5:
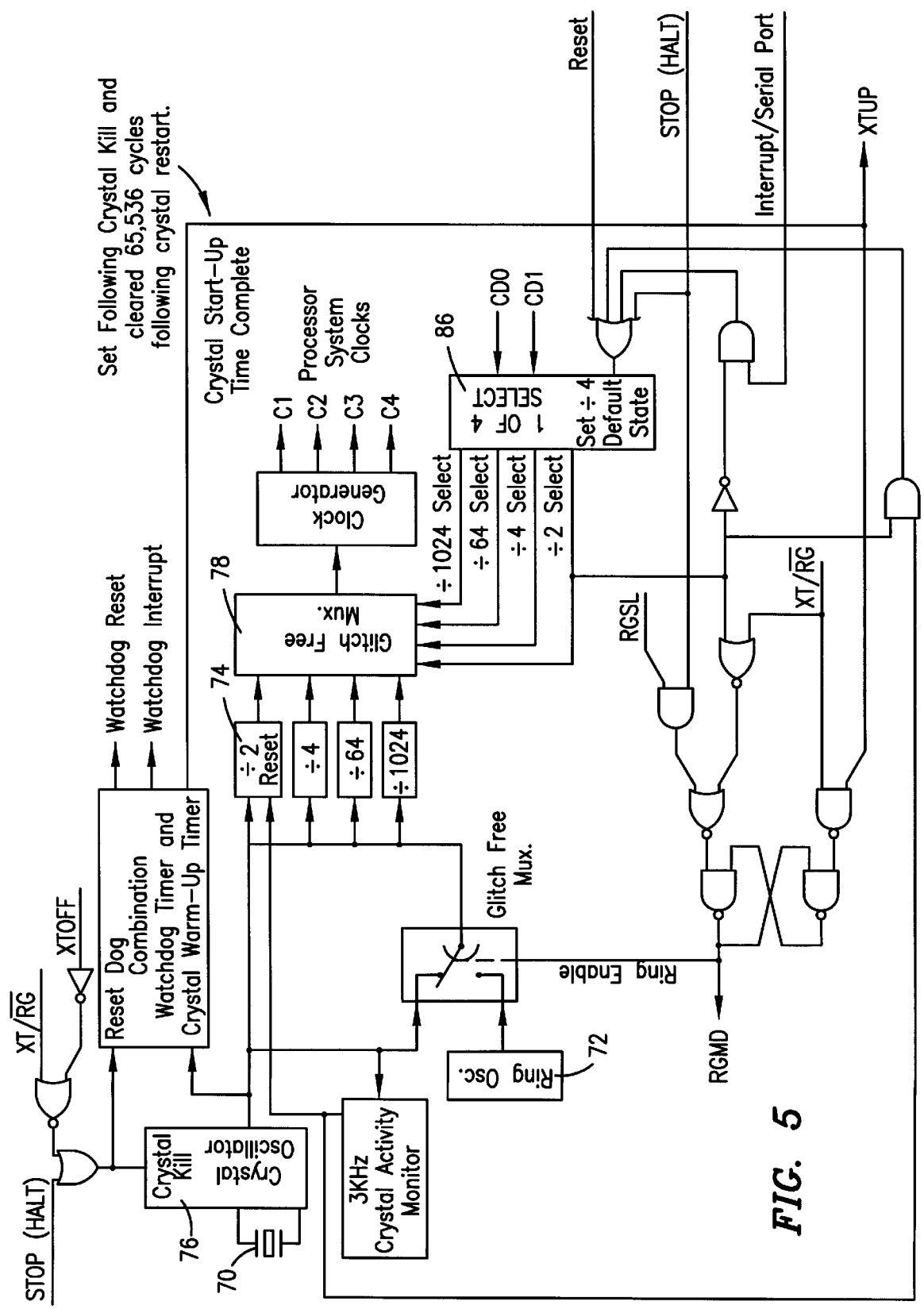
FIG. 5 is a functional/structural block circuit diagram showing at least a portion of the enhanced circuitry portion of an exemplary microprocessor.

Referring again to FIG. 2, FIG. 5 is a functional/structural block circuit diagram showing a portion of the enhanced circuitry 20 in FIG. 2 in greater detail.

The internal ring oscillator operates as follows. A register bit called "XTRG" located in "IN_RING" is generally selected as the control bit. If "XTRG" is set to be logic 1, an external crystal 70 of FIG. 5 will be the source to the system. Otherwise, if "XTRG" is set to be logic 0, internal ring oscillator 72 will be the source to the system. The default state is logic 1. That is, the system will use external crystal oscillator 70 as the main source clock when the system first powers up. In order to use internal ring oscillator 72, however, the user has to specify the address of "IN_RING" register, which is 91 HEX in preferred embodiments and place it onto the address bus 64 (FIG. 2), followed by the data the user wishes to write to the register and placed onto data bus 66. If the address on the DA corresponding to "IN_RING" register is present, an enable signal will be issued. Therefore, if a "write" operation is encountered, the data on data bus 66 will be written to "IN RING" on C4 clock. If a "read" operation is encountered, the data in "IN-RING" will be driven onto data bus 66.

Bit 3 is also of interest. If the user has decided to use internal ring oscillator as the source clock, the user would have to set "XTRG" to logic 0. The switching from external crystal oscillator 70 to the internal ring oscillator 72 will not occur until one machine cycle later, which ensures the switching function is glitch free and occurs at the beginning of a machine cycle.

"XTRG" bit is not affected by reset, but there are some conditions associated with this control bit. If the processor 10 is running at "divide by 2" (via "divide by 2" module 74 in FIG. 5) of external crystal 70, a signal called "ENDB2Z" will become active. This condition prevents the user from using the internal ring oscillator 72 as the main source clock. If the processor 10 has decided to disable external crystal 70, a signal called "IRG_ONZ" will become active. This signal prevents "XTRG" from changing from a logic 0 to logic 1 unless proper warm up time for the external crystal oscillator 70, 76 has elapsed.

In order to guarantee glitch free switching function of various divide ratio clocks, a state machine is introduced to govern the function. A signal called "XTAL" is the actual clock source going to system clock generator. There are four system clocks: C1, C2, C3, and C4 clocks (see FIG. 5), all of which are non-overlapping clocks, so that no two or more system clocks will be active at any given time. There is some delay introduced between the rising edge of "XTAL" and the rising edge of system clocks. Consequently, it is not a good idea to use system clocks as the sampling clocks.

Control bits, CD1 and CD0, are updated on every C1 cycle of each machine cycle. The control bits, CD1 and CD0 are used to select the output of one of the divide by circuits (÷2, ÷4, ÷64, ÷1024) (elements 74, 80, 82, 84, respectively) via the glitch free MUX 78. If a reset signal is received by the 1 of 4 select circuitry, the check is set to the default state. Another situation is the stop mode operation. When the processor 10 is to enter stop mode, a "HALT" signal will become active and trigger similar operations as a reset.

Regarding the software control of either an external crystal oscillator or an on-chip internal ring oscillator, preferred embodiments, as described and shown in the FIGURES and described above, the user can choose whether to use external crystal oscillator or internal ring oscillator as the main source clock to the system. More specifically, preferred embodiments have a plurality (e.g., four) of machine system clocks in one machine cycle: C1, C2, C3, C4. The internal address in preferred embodiments is updated on every C4 cycle. The "write" to the register occurs on C4 of last machine cycle of the "write" instruction. The "read" from the register occurs on C2 of last machine cycle of the "read" instruction. There are two data buses associated with the "write" and "read" operations: address bus 64 and data bus 66, both of them consist of eight data bus lines. The address bus 64 is normally used as a register address and data bus 66 is used as the data to or from the register.

Figure 6:
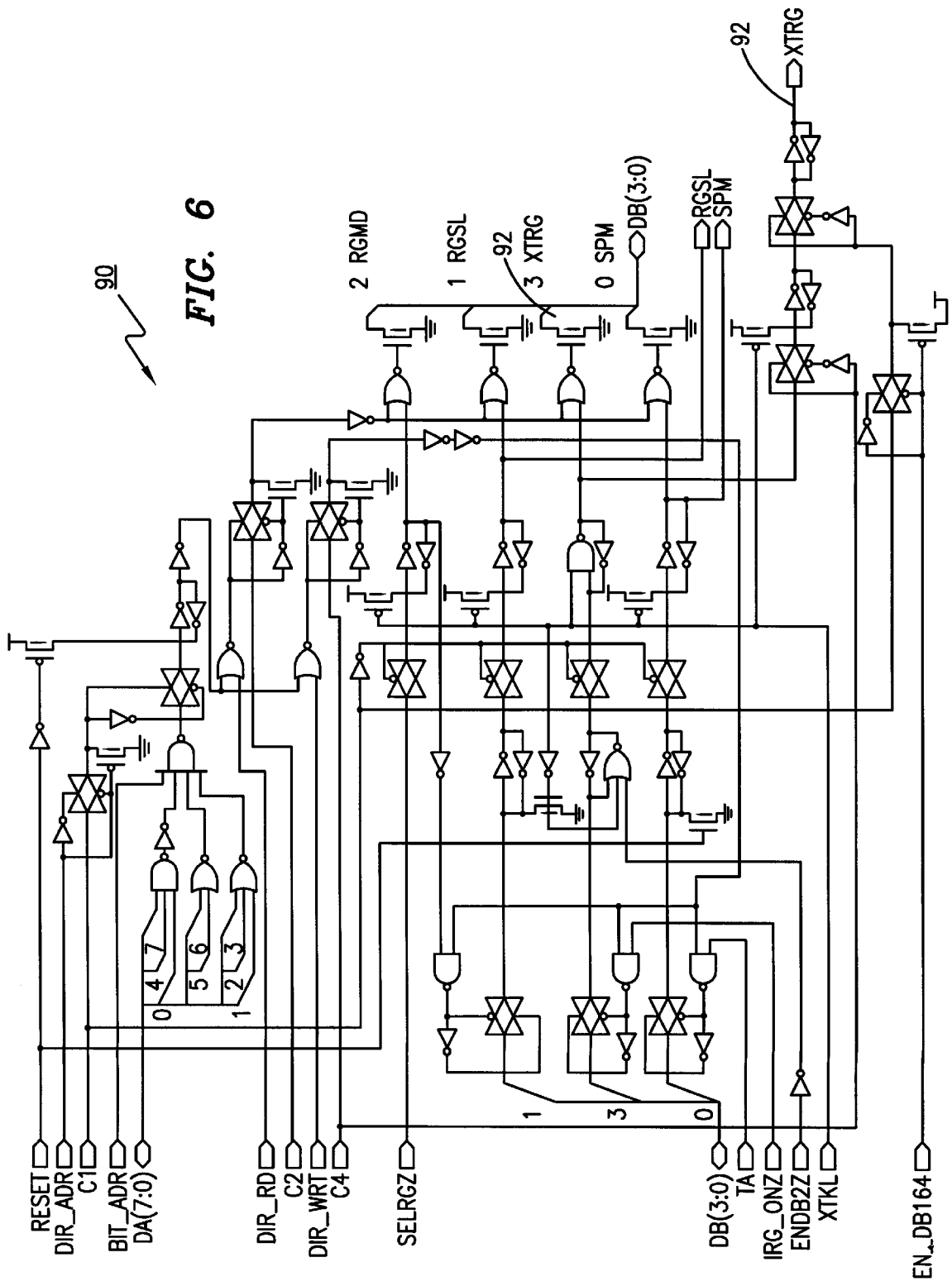
FIG. 6 is a preferred circuit diagram for a ring oscillator control circuit.

Regarding a ring oscillator control circuit 90 of FIG. 6, a register bit called "XTRG" located in "IN_RING" has been selected as the control bit. If "XTRG" is set to be logic 1, the external crystal 70 will be the source oscillation to the system. Otherwise, if "XTRG" 92 is set to be logic 0, internal ring oscillator 72 will be the source to the system. The default state is logic 1. That is, the system will use external crystal oscillator 70 as the main source clock when the system 10 first powers up. In order to use internal ring oscillator 72, however, the user has to specify the address of XTRG register and place it onto the address bus, followed by the data the user wishes to write to the register and placed onto data bus. If the address on the address bus corresponding to XTRG register, an enable signal will be issued. Therefore, if a "write" operation is encountered, the data on the data bus will be written to XTRG. If a "read" operation is encountered, the data in XTRG will be driven onto the data bus.

The bit of interest interested is bit 3 (See FIG. 6). If the user has decided to use the internal ring oscillator 72 as the source clock, he would have to set "XTRG" to logic 0. The switching from external crystal oscillator to internal ring oscillator will not occur until one machine cycle later. This is to insure the switching function is glitch free and occurs at the beginning of a machine cycle.

The "XTRG" bit is not affected by reset. There are some conditions associated with this control bit. If the processor is running at "divide by 2" of external crystal, a signal called "ENDB2Z" will be active. This condition is to prevent the user from using internal ring oscillator as the main source clock. If the processor has been running from internal ring oscillator and the user has decided to disable external crystal, the signal called "IRG_ONZ" will become active. This signal is to prevent "XTRG" to change from logic 0 to logic 1 unless proper warm up time for external crystal oscillator has elapsed. "XTRG" will be accessible by the user.

Regarding the operation of the crystal oscillator 76, the state of internal ring oscillator is set at logic 0. As long as "XTRG" is asserted, a clear signal will have no effect. However, if the user has deserted "XTRG", then the falling edge of ring will clear a latch and the ring oscillator will stop.

Preferred embodiments also provide for software control to disable/enable the external oscillator while running from the internal ring oscillator, so that the user has the ability to disable external oscillator to reduce current consumption tremendously. A bit called "XTOFF" (crystal off) has been designated to control whether the external crystal will be on or off. In order to access "XTOFF" bit, certain conditions have to be met before hand. One of which is to make sure the processor is running from internal ring oscillator, "XTRG" (crystal or ring) is set to logic 0. Otherwise "XTOFF" is stuck at logic 0, always.

If the user has specified to set "XTRG" logic 0 and "XTOFF" logic 1, then a "KILL" signal is issued and sent to "AGC" (automatic gain controller). Therefore, the on-chip crystal amplifier will be disabled. The processor will use less power and conserve energy. This is especially important in battery operations.

"XTRG" is not permitted to change from logic 0 to logic 1 while "XTOFF" is set to logic 1. The reason is that external crystal oscillator needs to have some warm-up time period before it becomes stable to use as clock source to the processor once it has been disabled by the user.

If "XTOFF" is deasserted, the signal will trigger internal watch dog to count for about 2.6 ms and then issue "XTUP" (crystal up) signal. "XTUP" is the indicator to the processor that external crystal is now available for use. Only at this time, the user will gain access to "XTRG".

Preferred embodiments provide for the software control to divide the main system clock (ring or external crystal oscillator) to provide lower operating current, which allows the user to change system clock divide ratio to lower operating current. More specifically, referring to SFR_PRR module, Two control bits, CD1 and CD0, are associated with this operation. They are located in "SFR_PRR" register bit 7 and bit 6 with address of C4 HEX. The default state when the processor first powers up is that CD1 is at logic 0 and CD1 is at logic 1. These two bits are affected by reset.

There are some restrictions associated with CD1 and CD0 bits. At any given time, if the state of the control its is not at the default state (01; CD1=0, CD0=1), no access to these bits will be granted without going through 01 state. For example, if CD1 and CD0 is at 10 state, a signal called "BLKZ" (block) will be active, then a "write" has occurred on C4 to change to 11 state, the 11 state will be latched to "master" latches on C4. However, the updated values are not permitted to propagate through on the following C1. The values in "master" latches will be overwritten by the values in "slave" latches on the following C2. As long as the state is at 10 or 11, "BLKZ" is active, always. Preferably, when the state has been changed to 01, a signal called "CLRZ" (clear) will be active and cause "BLKZ" to be inactive. Then the state of the control bits will be accessible once again. This mechanism is to insure proper divide ratio has been initiated from the default state. Another condition that will affect the control bits state is the stop mode operation. Whatever the control bit state is, if the stop mode has been initiated, a signal called "HALT" will be active to force CD1 and CD0 back to the default state (01).

In order to guarantee glitch free switching function of various divide ratio clocks, a state machine is introduced to govern the function. A signal called "XTAL" is the actual clock source going to system clock generator. There are four system clocks; C1, C2, C3, and C4. All four of them are non-overlapping clocks. That is no two or more system clocks will be active at any given time. And there is some delay introduced between the rising edge of "XTAL" and the rising edge of system clocks. Because of this nature, it is not a good idea to use system clocks as the sampling clocks. Therefore, a state machine is introduced to generate "system clock like" clocks.

SPECIAL FUNCTION REGISTER CONTROL BITS

EXTERNAL INTERRUPT FLAG REGISTER (EXIF; Special Function Address 91 Hex)

EXIF.3: XT/RG Crystal Oscillator/Ring Oscillator Select:

The XT/RG bit allows the processor to operate from either the External Oscillator (Crystal or external source) or the onboard Ring Oscillator. When XT/RG is set to a "1" the processor will operate from the external oscillator. When cleared to a "0" the processor will operate from the ring oscillator. In specific cases, the XT/RG bit is locked and cannot be altered due to the states that may exist on the XTOFF, or CD1/CD0 bits. These conditions are listed below. XT/RG is set to a "1" by a Power-On Reset and is unaffected by all other Reset functions.

A. XT/RG is not allowed to change from a "1" to a "0" if the CD1 & CD0 bits are set to the divide by 2 mode. The reason is that the divide by 2 option in the clock control circuit is not supported for the ring oscillator.

B. XT/RG cannot be changed from a "0" to a "1" until both XTOFF (PMR.3) and XTUP (STAT.4) are cleared to a "0". The reason is that the external oscillator can only be selected after it has been enabled to run and the 65,536 cycle crystal oscillator start-up period has elapsed.

EXIF.2: RGMD Ring Oscillator Mode:

RGMD=1 indicates that the ring oscillator is providing the system clock as controlled by either XT/RG or RGSL. RGMD=0 indicates that the crystal is providing the system clock.

EXIF.1: RGSL Ring Oscillator Select:

When programmed to a "1" RGSL will enable the ring oscillator to begin clocking the system following interrupt generated STOP mode removals. Once the ring is started it will run uninterrupted (even in the event of a RESET) until the completion of the crystal startup time. At this time the system will be automatically switched to the external crystal oscillator to continue running. When programmed to a "0" the system will not use the ring and will wait until the crystal startup time has been satisfied before the system will begin running from the crystal oscillator. Reset only on Power On Reset. Note that when a STOP mode is issued while running from the ring as programmed by the XT/RG control in bit 3, the system will not automatically restart the crystal oscillator or automatically switch to the external crystal oscillator. When the ring is selected as programmed via the XT/RG bit the processor will remain on the ring until either programmed to change or externally issued a Reset.

POWER MANAGEMENT REGISTER (PMR; Special Function Address C4 Hex)

PMR. 7: CD1 Clock Divide Control Bit 1:

PMR. 6: CD0 Clock Divide Control Bit 0:

The Clock Divide Control bits establish the number of clocks required by the crystal oscillator input (Xtal 1) to generate one machine cycle. A default value of 4 is selected after all Resets and STOP exits. Note that the basic divide by 12 mode for the Timers (TXM=0) as well as the divide by 33 and 64 for Mode 2 on the Serial Ports, has been maintained when running the processor with either 2 or 4 oscillator cycles per machine cycle. Serial Port Mode 0 tracks the oscillator cycles per machine cycle, as does the Timers and Serial Port Mode 2 when the higher divide ratios of 64 and 1024 are selected. Automatic Switch-Back functions and hardware blocks to the write function of the Clock Divide Control bits are outlined below.

or INT1\, detection of a low on INT3\ or INT5\ or a high on INT2 or INT4 when the respective pin has been program enabled to issue an interrupt. Although INT0\ through INT5\ are defined normally or programmed as edge generated interrupts, the Switch-Back mode senses all of these pins in a level detection scheme to improve the response time normally required due to the slower clocks used to test for edge relationships. Note that the Switch-Back interrupt relationship requires that the respective external interrupt source will be allowed to actually generate an interrupt as defined by the priority of the interrupt and the state of nested interrupts, before the Switch-Back will actually occur. The second Switch-Back condition will occur when either serial

| CD1 | CD0 15 | Osc. Cycles per Machine Cycle | Osc. Cycles per Timer 0 or 1 Clock (TOM or T1M) TXM = 0 TXM = 1 | | Osc. Cycles per Timer 2 Clock (T2M) T2M = 2 T2M = 1 | | Osc. Cycles per Serial Port Clock Mode 0 SM2 = 0 SM2 = 1 | | Osc. Cycles per Serial Port Clock Mode 2 SMOD = 0 |
|---|---|---|---|---|---|---|---|---|---|
| SMOD = L | | | | | | | | | |
| 0 | 0 | 2 | 12 | 2 | 2 | 1 | 6 | 2 | 64 | 32 |
| 0 | 1 | 4 (Reset Default) | 12 | 4 | 2 | 2 | 12 | 4 | 64 | 32 |
| 1 | 0 | 64 | 192 | 64 | 32 | 32 | 192 | 64 | 1,024 | 512 |
| 1 | 1 | 1,024 | 3,072 | 1,024 | 512 | 512 | 3,072 | 1,024 | 16,384 | 8,192 |

Figure 7:
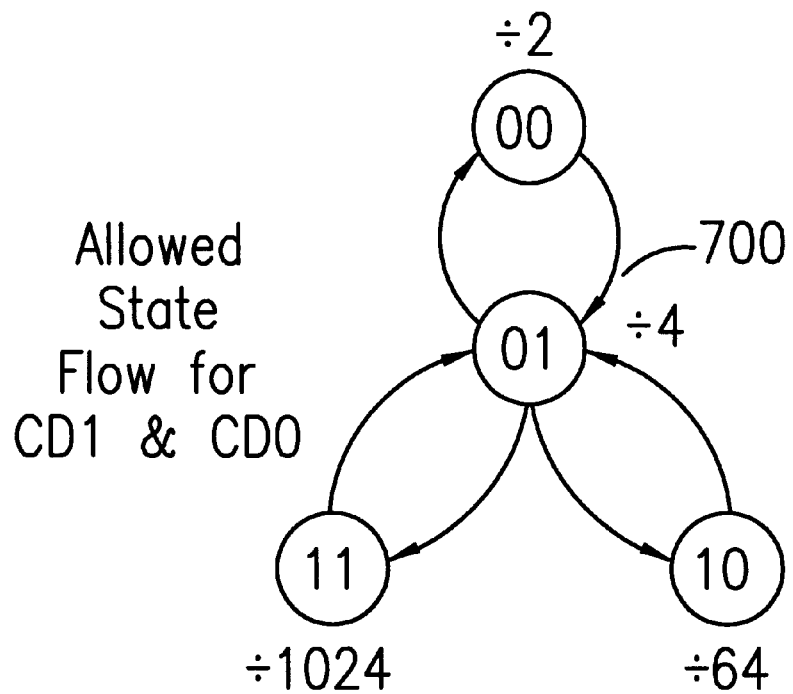
FIG. 7 is a state diagram corresponding power management register.

FIG. 7 is a state diagram corresponding power management register and the allowed state flow for CD1 and CD0. When changing the Clock Divide Control Bits (CD1 & CD0) certain restrictions must be observed. The default state of the divide by four mode 700 acts as the only state that any other divide ratio can be changed to or from, as outlined by the diagram in FIG. 7. As an example, attempting to change from a divide by 64 to a divide by 1024 will result in the CD1 and CD0 bit remaining set at the divide by 64 mode. The divide by 2 mode is only available when the processor is running from an external crystal or clock source, as programmed by the XT/RG bit. The XT/RG bit can only be cleared for ring operation if the divide by 2 mode is not selected by the CD1 & CD0 bits. Once the ring is 1024 L64 selected (XT/RG=0) the CD1 & CD0 bits are disabled from being programmed to a 00 Hex. The divide by 2 circuit is also disabled to conserve power when the ring oscillator is selected by the XT/RG bit and the crystal oscillator is disabled via the XTOFF bit. When the Automatic Switch-Back is enabled, and a respective Switch-Back source has been properly programmed, it will be impossible to change the Clock Divider Control bits to either a divide by 64 or 1024 until all respective sources are not active (see Switch-Back Enable). Movement between the divide by 2 and divide by 4 is not affected by the Switch-Back relationship.
PMR.5: SWB Switch-Back Enable:

Set to a "1", SWB will allow mask enabled external interrupts INT0–INT5 as well as enabled serial port receive functions to force the Clock Divide Control bits (when programmed 64 or 1024 cycles per machine cycle) to the Reset default state (divide by 4). When set to a "0" (Reset default state) SWB will disable the Switch-Back mode.

Figure 8:
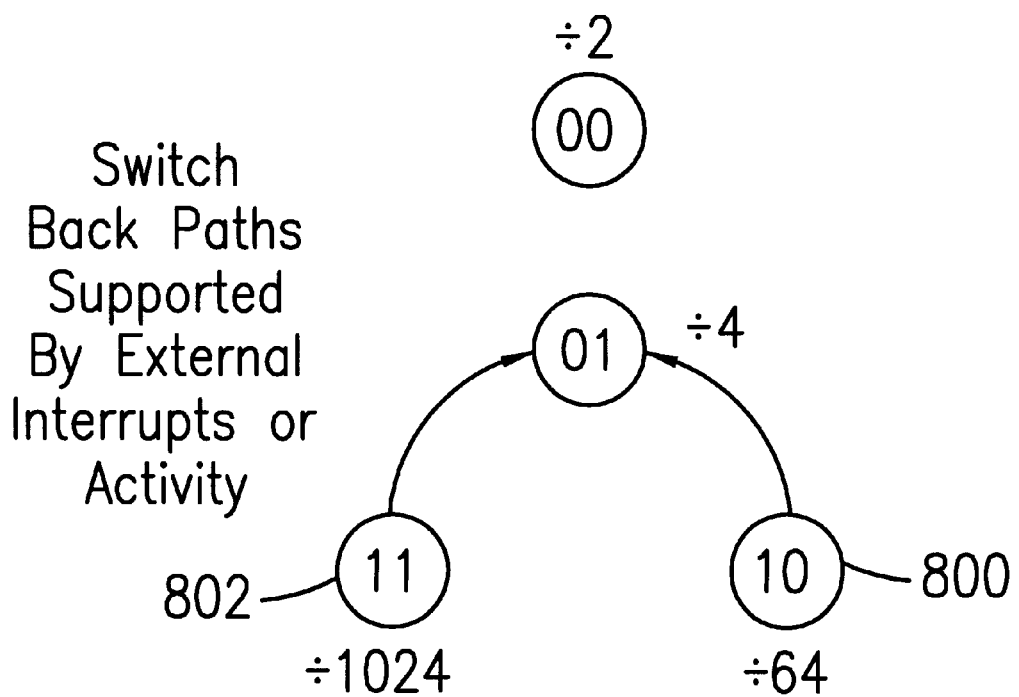
FIG. 8 is a state diagram corresponding power management register.

FIG. 8 is a state diagram corresponding to the switch-back enable. Switch back paths supported by external interrupts or serial port activity. Switch-Back paths are supported from either the divide by 64 or 1024 modes (800, 802). The first Switch-Back condition is initiated by the detection of a low (programmed as either edge or level detect) on either INT0\ port is enabled to receive data and is found to have an active low start bit on the respective receive input pin. Serial Port transmit activity will also force a Switch-Back if the SWB is set. Note that the Serial Port activity, as related to the Switch-Back is independent of the Serial Port Interrupt relationship. The automatic Switch-Back is only enabled when the Clock Divide Control bits have established either a divide by 64 or 1024 mode and the SWB bit is set to a "1".
PMR.4: DX2 Divide By 2 Clock Generator Enable The DX2 bit is cleared to a "0" on a Power-On Reset, and is unaffected by all other Reset functions. When programmed to a "0" the DX2 bit will disable the Divide by 2 Clock Generator to save energy and when programmed to a "1" the DX2 bit will enable the Divide by 2 Clock Generator. The Divide by 2 Clock Generator requires a start-up stabilization period equal to the standard start-up time of the crystal oscillator. Setting DX2 to a "1" from a previous "0" will automatically clear the XTUP bit in the status register and restart the crystal start-up time-out in the Watchdog Timer. During the Watchdog count of the required 65536 crystal clocks, the XTUP bit will remain cleared and the CD0, and CD1 clock controls will not be allowed to be set to the divide by 2 option. Setting RWT during the start-up period while XTUP is low will result in the Watchdog being cleared immediately following the start-up time-out. DX2 can not be changed from a "1" to a "0" while the divide by 2 option is selected via the CD0, and CD1 clock control bits. Although the DX2 bit is unaffected by normal Resets, it will be cleared if the crystal is stopped either via the XTOFF bit, by the external removal of the crystal or external clock, or by enabling the STOP mode (see function description of the Divide by 2 Generator).
PMR.3 XTOFF Crystal Oscillator Enable:

The XTOFF bit provides a means to disable the external crystal oscillator after the processor has been programmed to run from the on-board ring oscillator. When the XTOFF bit is set to a "1" the external oscillator will be disabled. When XTOFF is cleared to a "0" the crystal oscillator will be left to operate as normal. Note that even when not selected by the XT/RG bit the crystal oscillator can still be stopped through the use of the standard STOP mode bit in the PCON register. Setting the XTOFF bit to a "1" is only allowed when the XT/RG bit in the EXIF register has been cleared to a "0" (ring operation). Programming the XTOFF bit to a "0" ran be done at any time, independent of all other states. When changing the processor clock from the ring to the crystal oscillator (using the XT/RG bit), it is necessary that the proper start-up time be allowed before switching from the ring to the crystal. The status of the start-up time for the crystal is given in the XTUP bit in the STAT register. When the XTOFF bit is programmed from a "1" to a "0", an internal count from the watchdog counter will count the standard 65,536 crystal oscillator cycles and indicate through the XTUP bit in the STAT register when the count is completed. Controls are provided to prevent the XT/RG bit from being set immediately after turning on the crystal oscillator, (XTOFF=>1). The lock-out of the XT/RG bit allows the standard oscillator start-up period to first elapse (Note: XTUP STAT.4) before switching back to the crystal oscillator. Setting RWT during the start-up period while XTUP is low will result in the Watchdog being cleared immediately following the start-up time-out.

STATUS REGISTER (STAT; Special Function Address C5 Hex)

STAT. 4: XTUP Crystal Oscillator Warm Up Status:

The XTUP bit indicates the status of the 65,536 clock period delay used to establish the crystal oscillator or Divide by 2 Clock Generator warm-up period. When XTUP is set to "0", the counter for the 65,653 clocks is still counting. When XTUP is cleared to a "1", the count has been completed.

This status bit is cleared each time the crystal oscillator is restarted following a period of being disabled via a STOP mode or the setting of the XTOFF bit in the PMR register. Once the XTUP is set, all lock-outs on the XT/RG bit are removed to allow the processor to use the crystal oscillator clock source.

The XTUP bit is also cleared each time the DX2 bit (PMR.4) is changed from a low to a high to start the Divide by 2 Clock Generator. Once the XTUP is set, all lock-outs on the divide by 2 option via CD0, and CD1 bit are removed to allow the processor to use the Divide by 2 Generator as a system clock source.

Note that XTUP functions differs from that of the RGMD bit in the EXIF register. The XTUP bit is used to monitor the crystal oscillator (or Divide by 2 Clock Generator) warm-up time and the RGMD is used to establish which clock (Ring or Crystal) is being used to clock the processor. When the system uses the XT/RG (EXIF.3) aid XTOFF (PMR.3), control bits to change and control the processor clocks, the two bits change and function independent of each other. When the system is programmed to exit a STOP mode with the ring oscillator and to automatically return to the crystal oscillator after the warm-up period (RGSL=1, XT/RG=1) the two bits again act independently, but will appear to change at the same time. When the ring is selected to act as the primary system clock via the XT/RG=0, the RGSL bit will become a don't care condition.

FURTHER MODIFICATIONS AND VARIATIONS

Although the invention has been described with reference to a specific embodiment, this description is not meant to be construed in a limiting sense. As described above, various modifications of the disclosed embodiment as well as alternate embodiments of the invention will become apparent to persons skilled in the art upon reference to the description of the invention. While it is clear from the above discussion, that preferred embodiments implement the disclosed circuitry in an integrated circuit on a monolithic semiconductor substrate (e.g., silicon) portions of the circuitry may be moved "off-chip" depending upon the application and design requirements. Accordingly, it should be understood that the modifications and variations suggested above are not intended to be exhaustive.

What is claimed is:

1. A microprocessor circuit comprising:

a microprocessor core;

a first oscillator circuit for outputting a first signal, said first oscillator circuit configurable in a powered-up state and a powered-down state;

a second oscillator circuit for outputting a second signal;

a switch connected to the first oscillator circuit and the second oscillator circuit, the switch for receiving the first signal and the second signal, and the switch further for outputting an operating clock signal to the microprocessor core, wherein the operating clock signal is generated responsive to one of the first signal and the second signal; and means for selectively powering-down said first oscillator circuit, thereby reducing power consumption by the first oscillator circuit and placing the first oscillator in the powered-down state;

wherein said microprocessor core is configured to operate according to the operating clock signal generated responsive to the second signal when the first oscillator circuit is in the powered-down state.

2. The microprocessor circuit of claim 1, further comprising:

means for selectively powering-up said first oscillator circuit, thereby bringing the first oscillator circuit from the powered-down state to the powered-up state;

wherein said microprocessor core is configured to operate according to the operating clock signal generate responsive to the first signal when the first oscillator circuit is powered-up.

3. The microprocessor circuit of claim 1, wherein the first oscillator circuit is an external oscillator circuit.

4. The microprocessor circuit of claim 3, wherein the second oscillator circuit is an internal ring oscillator circuit.

5. The microprocessor circuit of claim 1, further comprising:

a divide-by circuit connected to the switch, the divide-by circuit configured to divide one of the first signal and the second signal to thereby generate the operating clock signal.

6. A microprocessor circuit comprising:

a microprocessor core;

a first oscillator circuit for outputting a first signal, the first oscillator circuit configured to be in one of a powered-down state and a powered-up state;

a second oscillator circuit for outputting a second signal;

a switch connected to the first oscillator circuit and the second oscillator circuit, the switch for receiving the first signal and the second signal, and the switch further for outputting an operating clock signal to the microprocessor core, wherein the operating clock signal is produced from one of the first signal and the second signal; and means for selectively powering-up said first oscillator circuit, thereby bringing the first oscillator circuit from the powered-down state to the powered-up state;

wherein said microprocessor core is configured to operate according to the operating clock signal generated responsive to the first signal when the first oscillator circuit is powered-up.

7. The microprocessor circuit of claim 6, further comprising:

means for selectively powering-down said first oscillator circuit, thereby bringing the first oscillator circuit from the powered-up state to the powered-down state;

wherein said microprocessor core is configured to operate according to the operating clock signal generated responsive to the second signal when the first oscillator circuit is powered-down.

8. The microprocessor circuit of claim 7, wherein the means for selectively powering-down is configured to power-down said first oscillator through a controlled power-down.

9. The microprocessor circuit of claim 6, wherein the first oscillator circuit is an external oscillator circuit.

10. The microprocessor circuit of claim 9, wherein the second oscillator circuit is an internal ring oscillator circuit.

11. The microprocessor circuit of claim 6, further comprising:

a divide-by circuit connected to the switch, the divide-by circuit configured to divide one of the first signal and the second signal to thereby generate the operating clock signal.

* * * * *

UNITED STATES PATENT AND TRADEMARK OFFICE
CERTIFICATE OF CORRECTION

PATENT NO. : 6,219,797 B1  
DATED : April 17, 2001  
INVENTOR(S) : Liu et al.

Page 1 of 1

It is certified that error appears in the above-identified patent and that said Letters Patent is hereby corrected as shown below:

Column 11,  
Line 49, replace "referred" with -- preferred --  
Line 65, replace "lock" with -- clock --

Column 14,  
Line 29, replace "uses" with -- user --

Column 18,  
Line 49, replace "writf" with -- write --

Signed and Sealed this

Nineteenth Day of February, 2002

Attest:

JAMES E. ROGAN  
*Attesting Officer*  *Director of the United States Patent and Trademark Office*